(12) United States Patent　　　　　(10) Patent No.:　US 12,692,590 B2

Ikeda et al.　　　　　　　　　　　　(45) Date of Patent:　　　Jul. 28, 2026

(54) FILM FORMATION APPARATUS

(71) Applicant: Japan Display Inc., Tokyo (JP)

(72) Inventors: Masanobu Ikeda, Tokyo (JP); Masumi Nishimura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 19/017,907

(22) Filed: Jan. 13, 2025

(65) Prior Publication Data

US 2025/0146125 A1　　May 8, 2025

Related U.S. Application Data

(63) Continuation of application No. PCT/JP2023/020438, filed on Jun. 1, 2023.

(30) Foreign Application Priority Data

Jul. 25, 2022　(JP) ................................. 2022-117918

(51) Int. Cl.
　　*H01J 37/34*　　　　(2006.01)
　　*C23C 14/34*　　　　(2006.01)
　　　　　(Continued)

(52) U.S. Cl.
　　CPC ...... *C23C 14/3414* (2013.01); *C23C 14/3457* (2013.01); *C23C 14/50* (2013.01);
　　　　　(Continued)

(58) Field of Classification Search
　　CPC .... H01J 37/34; H01J 37/3411; H01J 37/3464; H01J 37/3467; H01J 37/3476;
　　　　　(Continued)

(56) References Cited

U.S. PATENT DOCUMENTS

| | | | | |
|---|---|---|---|---|
| 2020/0402774 A1* | 12/2020 | Yasui | .................... | H01J 37/321 |
| 2021/0217618 A1* | 7/2021 | Takahashi | ............... | C23C 14/34 |

FOREIGN PATENT DOCUMENTS

| | | |
|---|---|---|
| JP | 2008021745 A | 1/2008 |
| JP | 2020147837 A | 9/2020 |

(Continued)

OTHER PUBLICATIONS

English machine translation of Office Action dated Oct. 28, 2025, issued in JP Appl. No. 2024-536814, 4 pages.

(Continued)

*Primary Examiner* — Rodney G McDonald
(74) *Attorney, Agent, or Firm* — Maier & Maier, PLLC

(57)　　　　　　ABSTRACT

A film formation apparatus includes a vacuum chamber, a substrate support portion and a target support portion provided in the vacuum chamber, a sputtering gas supply unit for supplying a sputtering gas to the vacuum chamber, a sputtering power supply, a first radical supply source connected to the vacuum chamber and configured to be capable of supplying at least one of nitrogen radicals generated from an $N_2$ gas and hydrogen radicals generated from an $H_2$ gas to the vacuum chamber, a second radical supply source connected to the vacuum chamber and configured to be capable of supplying SiH3 radicals to the vacuum chamber, and a control unit configured to control the sputtering gas supply unit, the sputtering power supply, the first radical supply source, and the second radical supply source.

14 Claims, 17 Drawing Sheets

(51) Int. Cl.
   *C23C 14/50*  (2006.01)
   *C23C 14/54*  (2006.01)
   *H01J 37/32*  (2006.01)
(52) U.S. Cl.
   CPC ........ *C23C 14/54* (2013.01); *H01J 37/32449*
       (2013.01); *H01J 37/34* (2013.01); *H01J*
       *37/3411* (2013.01); *H01J 37/3426* (2013.01);
           *H01J 37/3464* (2013.01); *H01J 37/3467*
                 (2013.01); *H01J 37/3476* (2013.01)
(58) Field of Classification Search
   CPC ............ H01J 37/3426; H01J 37/32449; C23C
                    14/3414; C23C 14/3457; C23C 14/50;
                   C23C 14/54; C23C 14/0057; C23C
                14/0063; C23C 14/0073; C23C 14/0047;
                 C23C 14/0617; C23C 14/30; C23C
                  14/3485; H10P 14/29; H10P 14/60

USPC .......................... 204/298.03, 298.26, 298.07
   See application file for complete search history.

(56)                References Cited

FOREIGN PATENT DOCUMENTS

JP        2020164927  A     10/2020
WO        2019/167715  A1    6/2019
WO        2020/075599  A1    4/2020

OTHER PUBLICATIONS

English machine translation of International Search Report dated
Aug. 22, 2023 issued in PCT/JP2023/020438, 5 pages.

* cited by examiner

10A

FILM FORMATION APPARATUS

CROSS-REFERENCE TO RELATED APPLICATIONS

This application is a Continuation of International Patent Application No. PCT/JP2023/020438, filed on Jun. 1, 2023, which claims the benefit of priority to Japanese Patent Application No. 2022-117918, filed on Jul. 25, 2022, the entire contents of which are incorporated herein by reference.

FIELD

An embodiment of the present invention relates to a film formation apparatus for forming a gallium nitride film.

BACKGROUND

In a small or medium-sized display device such as a smart phone, a display using liquid crystals or OLEDs (Organic Light Emitting Diodes) has been commercialized. In particular, an OLED display device using the OLEDs which are self-light emitting elements has the advantages of high-contrast and does not require a backlight, as compared with a liquid crystal display device. However, since the OLEDs are composed of organic compounds, it is difficult to secure high reliability of the OLED display device due to deterioration of the organic compounds.

In recent years, a so-called micro LED display device and a mini LED display device in which minute LED chips are mounted in pixels of a circuit substrate have been developed as next-generation display devices. The LED is a self-light emitting element similar to the OLED, but unlike OLED, the LED is composed of stable inorganic compounds containing gallium (Ga) or indium (In), and therefore, it is easy to ensure high reliability of the micro LED display device as compared with the OLED display device. In addition, the LED has high light emission efficiency and high brightness can be realized. Therefore, the micro LED display device is expected to be a next-generation display with high reliability, high brightness, and high contrast.

A gallium nitride film used in the micro LED and the like is generally formed on a sapphire substrate by Metal Organic Chemical Vapor deposition (MOCVD) or Hydride Vapor Phase Epitaxy (HVPE) at a high temperature of 800° C. to 1000° C. Recently, however, the formation of the gallium nitride film by sputtering, which can be formed at relatively low temperatures, has been developed (for example, see Japanese laid-open patent publication No. 2020-164927).

SUMMARY

A film formation apparatus according to an embodiment of the present invention includes a vacuum chamber capable of evacuating an interior thereof, a substrate support portion provided in the vacuum chamber and configured to support a substrate, a target support portion provided in the vacuum chamber and configured to support a target containing nitrogen and gallium, a sputtering gas supply unit connected to the vacuum chamber and configured to supply a sputtering gas to the vacuum chamber, a sputtering power supply configured to apply a voltage to the target, a first radical supply source connected to the vacuum chamber and configured to be capable of supplying at least one of nitrogen radicals generated from an $N_2$ gas and hydrogen radicals generated from an $H_2$ gas to the vacuum chamber, a second radical supply source connected to the vacuum chamber and configured to be capable of supplying SiH3 radicals to the vacuum chamber, and a control unit configured to control the sputtering gas supply unit, the sputtering power supply, the first radical supply source, and the second radical supply source.

A film formation apparatus according to an embodiment of the present invention includes a vacuum chamber capable of evacuating an interior thereof, a substrate support portion provided in the vacuum chamber and configured to support a substrate, a target support portion provided in the vacuum chamber and configured to support a target containing nitrogen and gallium, a sputtering gas supply unit connected to the vacuum chamber and configured to supply a sputtering gas to the vacuum chamber, a sputtering power supply configured to apply a voltage to the target, a radical supply source connected to the vacuum chamber and configured to be capable of supplying at least one of nitrogen radicals generated from an $N_2$ gas and hydrogen radicals generated from an $H_2$ gas to the vacuum chamber, a dopant supply source connected to the vacuum chamber and configured to be capable of supplying a dopant to the vacuum chamber, and a control unit configured to control the sputtering gas supply unit, the sputtering power supply, the radical supply source, and the dopant supply source.

DESCRIPTION OF EMBODIMENTS

Figure 1:
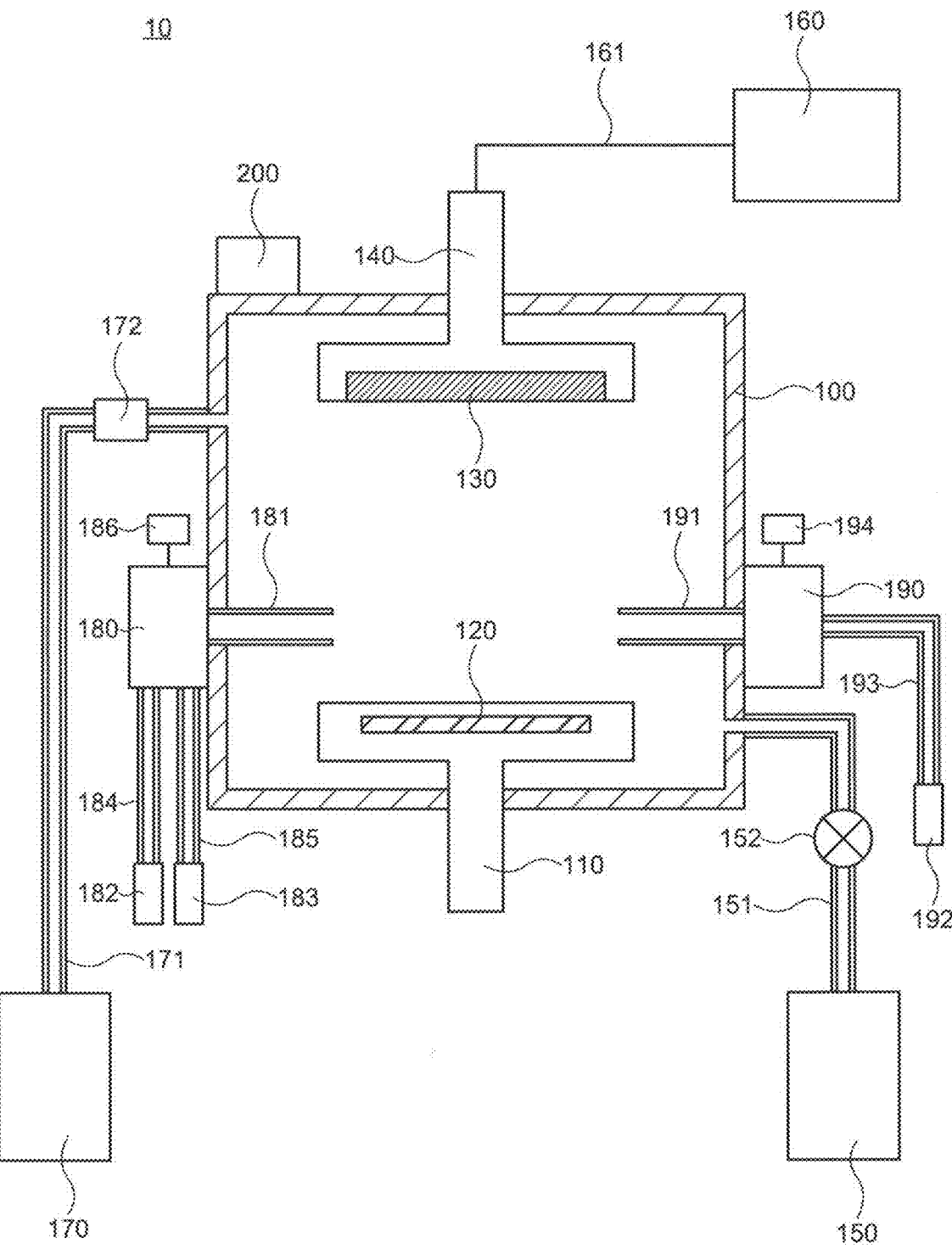
FIG. 1 is a schematic diagram showing a configuration of a film formation apparatus according to an embodiment of the present invention.

In a micro LED, it is necessary to form an n-type semiconductor layer and a p-type semiconductor layer. However, when a gallium nitride film is formed at a low temperature, it is difficult to control a dopant in the gallium nitride film.

In view of the above problems, an embodiment of the present invention can provide a film formation apparatus that improves the controllability of a dopant in a gallium nitride film formed at low temperatures.

Hereinafter, each of the embodiments of the present invention is described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expression "α includes A, B, or C," "α includes any of A, B, or C," "α includes one selected from a group consisting of A, B and C," and the like does not exclude the case where α includes a plurality of combinations of A to C unless otherwise specified. Further, these expressions do not exclude the case where α includes other components.

In the present specification, although the phrase "on" or "over" or "under" or "below" is used for convenience of explanation, in principle, the direction from a substrate toward a structure is referred to as "on" or "over" with reference to a substrate in which the structure is formed. Conversely, the direction from the structure to the substrate is referred to as "under" or "below." Therefore, in the expression of "a structure over a substrate," one surface of the structure in the direction facing the substrate is the bottom surface of the structure and the other surface is the upper surface of the structure. In addition, the expression of "a structure over a substrate" only explains the vertical relationship between the substrate and the structure, and another member may be placed between the substrate and the structure. Furthermore, the term "on" or "over" or "under" or "below" means the order of stacked layers in the structure in which a plurality of layers is stacked, and may not be related to the position in which layers overlap in a plan view.

In the specification, terms such as "first," "second," or "third" attached to each configuration are convenient terms used to distinguish each component, and have no further meaning unless otherwise explained.

In the specification and the drawings, the same reference numerals may be used when multiple components are identical or similar in general, and reference numerals with a lower or upper case letter of the alphabet may be used when the multiple components are distinguished. Further, reference numerals with a hyphen and a natural number may be used when multiple portions of one component are distinguished.

In the specification, a cation and an anion may be referred to as a positive ion and a negative ion, respectively.

The following embodiments can be combined with each other as long as there is no technical contradiction.

First Embodiment

A film formation apparatus 10 according to an embodiment of the present invention is described with reference to FIGS. 1 to 7.

[1. Configuration of the Film Formation Apparatus 10]

FIG. 1 is a schematic diagram showing a configuration of the film formation apparatus 10 according to an embodiment of the present invention. Mainly, a gallium nitride film containing an n-type dopant can be formed using the film formation apparatus 10. Hereinafter, for convenience, the configuration of the film formation apparatus 10 is described assuming that the n-type dopant of the gallium nitride film is silicon. However, the n-type dopant is not limited to silicon.

As shown in FIG. 1, the film formation apparatus 10 includes a vacuum chamber 100, a substrate support portion 110, a heating unit 120, a target 130, a target support portion 140, a pump 150, a sputtering power supply 160, a sputtering gas supply unit 170, a first radical supply source 180, a second radical supply source 190, and a control unit 200.

The substrate support portion 110, the heating unit 120, the target 130, and the target support portion 140 are provided in the vacuum chamber 100. The substrate support portion 110 and the heating unit 120 are provided at a lower part in the vacuum chamber 100. A substrate is placed on the substrate support portion 110. The heating unit 120 is provided in the substrate support 110 and is capable of heating the substrate placed on the substrate support portion 110. The target 130 and the target support portion 140 are provided at an upper part in the vacuum chamber 100. The target 130 is supported by the target support portion 140 and is provided to face the substrate placed on the substrate support portion 110.

In addition, although FIG. 1 shows a configuration in which the substrate support portion 110 and the heating unit 120 are provided at the lower part in the vacuum chamber 100 and the target 130 and the target support portion 140 are provided at the upper part in the vacuum chamber 100, these positions may be reversed.

The target 130 is gallium nitride containing nitrogen and gallium. In the composition ratio of the gallium nitride in the target 130, it is preferable that gallium with respect to nitrogen is greater than or equal to 0.5 and less than or equal to 2. The nitrogen of the gallium nitride film formed on the substrate is supplied from the target 130 and the first radical supply source 180, while the gallium of the gallium nitride film is supplied only from the target 130. Therefore, it is preferable that the composition of the gallium nitride of the target 130 contains more gallium than nitrogen.

The pump 150, the sputtering power supply 160, the sputtering gas supply unit 170, the first radical supply source 180, and the second radical supply source 190 are provided outside the vacuum chamber 100.

The pump 150 is connected to the vacuum chamber 100 through a pipe 151. The pump 150 can exhaust gas from the vacuum chamber 100 through the pipe 151. That is, the inside of the vacuum chamber 100 can be evacuated by the pump 150 connected to the vacuum chamber 100. Further, the pressure in the vacuum chamber 100 can be kept constant by opening and closing a valve 152 connected to the pipe 151. For example, a turbo molecular pump or a cryopump can be used as the pump 150.

The sputtering power supply 160 is electrically connected to the target 130 via wiring 161. The sputtering power supply 160 can generate a direct current voltage (DC voltage) or an alternating current voltage (AC voltage) and apply the generated voltage to the target 130. The frequency of the AC voltage is 13.56 MHz. The sputtering power supply 160 can also apply a bias voltage to the target 130 and further apply a DC voltage or an AC voltage.

The sputtering power supply 160 may periodically change a voltage applied to the target 130. For example, a voltage is applied to the target 130 for a period of 1 μsec to 1 msec, and then the application of the voltage to the target 130 may be stopped for a period of 1 μsec to 100 msec. In the film formation apparatus 10 according to the present embodiment, a period in which a voltage is applied to the target 130 and a period in which a voltage is not applied to the target 130 are repeated to form a gallium nitride film. In addition, hereinafter, a state in which a voltage is applied to the target 130 may be referred to as an "on-state of the sputtering power supply 160", and a state in which a voltage is not applied to the target 130 may be referred to as an "off-state of the sputtering power supply 160."

The sputtering gas supply unit 170 is connected to the vacuum chamber 100 through a pipe 171. The sputtering gas supply unit 170 can supply a sputtering gas to the vacuum chamber 100 through the pipe 171. Further, the flow rate of the sputtering gas can be controlled by a mass flow controller 172 connected to the pipe 171. Argon (Ar) or krypton (Kr) can be used as the sputtering gas supplied from the sputtering gas supply unit 170.

The first radical supply source 180 is connected to a pipe 181 provided in the vacuum chamber 100. Further, a nitrogen gas supply unit 182 is connected to the first radical supply source 180 through a pipe 184, and a hydrogen gas supply unit 183 is connected to the first radical supply source 180 through a pipe 185. The nitrogen gas supply unit 182 can supply a nitrogen gas ($N_2$ gas) to the first radical supply source 180 through the pipe 184. The hydrogen gas supply unit 183 can supply a hydrogen gas ($H_2$ gas) to the first radical supply source 180 through the pipe 185. That is, the $N_2$ gas and the $H_2$ gas can be supplied to the first radical supply source 180 through separate pipes in the film formation apparatus 10.

A first plasma power source 186 is connected to the first radical supply source 180. The first plasma power source 186 can generate radicals of the $N_2$ gas and the $H_2$ gas supplied to the first radical supply source 180. In other words, the first radical supply source 180 can generate nitrogen radicals and hydrogen radicals from the $N_2$ gas and the $H_2$ gas, respectively. The nitrogen radicals and the hydrogen radicals generated by the first radical supply source 180 are supplied to the vacuum chamber 100 through the pipe 181. The pipe 181 may be provided with one end facing the substrate support portion 110. In this case, the nitrogen radicals and the hydrogen radicals can be irradiated from one end of the pipe 181 toward the substrate placed on the substrate support portion 110.

The second radical supply source 190 is connected to a pipe 191 provided in the vacuum chamber 100. Further, a doping gas supply unit 192 is connected to the second radical supply source 190 through a pipe 193. The doping gas supply unit 192 can supply a doping gas to the second radical supply source 190 through the pipe 193. For example, the doping gas is a silane gas ($SiH_4$ gas).

A second plasma power source 194 is connected to the second radical supply source 190. The second plasma power source 194 can generate $SiH_x$ ($x$=1 to 3) radicals from the $SiH_4$ gas supplied to the second radical supply source 190. The second radical supply source 190 can selectively generate only the $SiH_3$ radicals by using the difference in the lifetime of each radical. In other words, the second radical supply source 190 can generate the $SiH_3$ radicals from the $SiH_4$ gas. The $SiH_3$ radicals generated by the second radical supply source 190 are supplied to the vacuum chamber 100 through the pipe 193. The pipe 191 may be provided with one end of the pipe 191 facing the substrate support portion 110. In this case, the $SiH_3$ radicals can be irradiated from one end of the pipe 191 toward the substrate placed on the substrate support portion 110.

In addition, the first radical supply source 180 and the second radical supply source 190 may be provided in the vacuum chamber 100.

The control unit 200 can control the operation of the film formation apparatus 10 in forming the gallium nitride film. The control unit 200 is a computer that can perform arithmetic processing using data or information, and includes, for example, a central processing unit (CPU), a microprocessor (MPU), or a random access memory (RAM). Specifically, the control unit 200 executes a predetermined program to control the operation of the film formation apparatus 10. Here, the details of the control of the control unit 200 are described with reference to FIG. 2.

Figure 2:
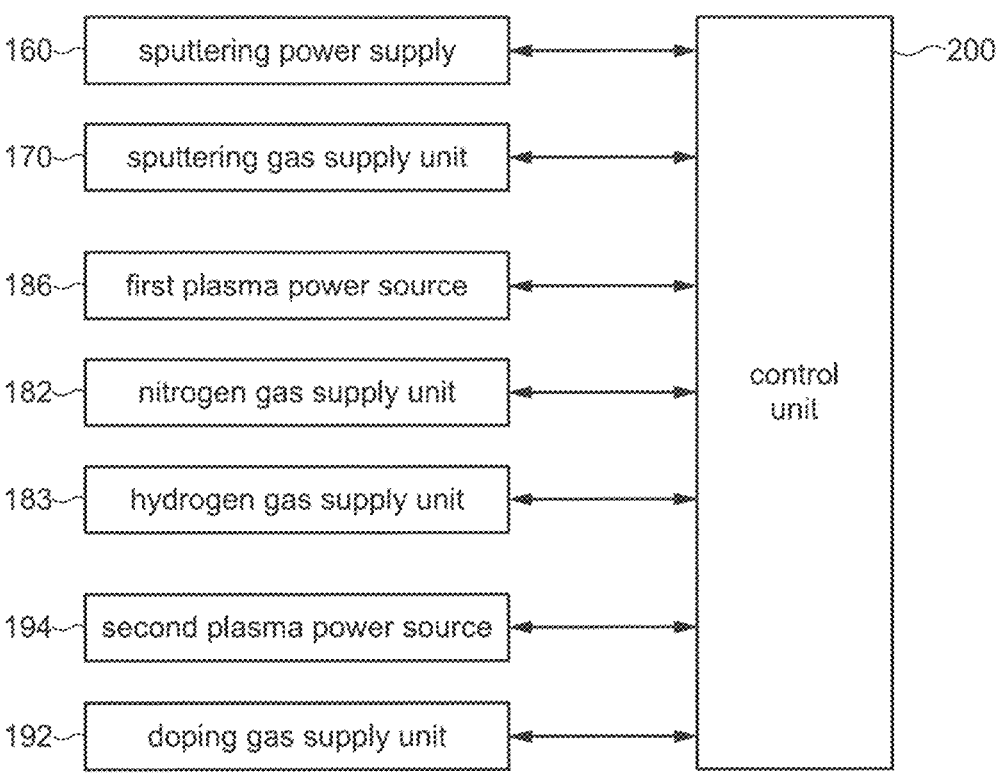
FIG. 2 is a block diagram showing connections of a control unit of a film formation apparatus according to an embodiment of the present invention.

FIG. 2 is a block diagram showing connections in the control unit 200 of the film formation apparatus 10 according to an embodiment of the present invention.

As shown in FIG. 2, the control unit 200 is connected to the sputtering power supply 160 and the sputtering gas supply unit 170. Therefore, the control unit 200 can control the on- or off-state of the sputtering power supply 160 and the start or stop of the supply of the sputtering gas to the vacuum chamber 100. In addition, although FIG. 2 shows a configuration in which the control unit 200 is connected to the sputtering gas supply unit 170, the control unit 200 may be connected to the mass flow controller 172 to control the start or stop of the supply of the sputtering gas by the mass flow controller 172.

Further, the control unit 200 is connected to the nitrogen gas supply unit 182, the hydrogen gas supply unit 183, and the first plasma power source 186. Therefore, the control unit 200 can control the start or stop of the supply of the $N_2$ gas to the first radical supply source 180, the start or stop of the supply of the $H_2$ gas to the first radical supply source 180, and the start or stop of the generation of the nitrogen radicals or the hydrogen radicals. In addition, when the nitrogen radicals or the hydrogen radicals are not generated in the first radical supply source 180, the $N_2$ gas or the $H_2$ gas can be supplied to the vacuum chamber 100. That is, the first radical supply source 180 can supply at least one of the $N_2$ gas, the $H_2$ gas, the nitrogen radicals, and the hydrogen radicals to the vacuum chamber 100 by the control of the control unit 200. Therefore, for convenience, the following description may be described as the control unit 200 controls the first radical supply source 180.

Further, the control unit 200 is connected to the doping gas supply unit 192 and the second plasma power source 194. Therefore, the control unit 200 can control the start or stop of the supply of the doping gas to the second radical supply source 190 and the start or stop of the generation of the $SiH_3$ radicals. When the second radical supply source 190 does not generate the $SiH_3$ radicals, the $SiH_4$ gas is supplied to the vacuum chamber 100. That is, the second radical supply source 190 can supply the $SiH_4$ gas or the $SiH_3$ radicals to the vacuum chamber 100 by the control of the control unit 200. Therefore, for convenience, the following description may be described as the control unit 200 controls the second radical supply source 190.

Furthermore, the control unit 200 may control the pump 150 so that a predetermined pressure is maintained in the vacuum chamber 100. The control unit 200 may control the heating unit 120 so that the substrate placed on the substrate support portion 110 is heated at a predetermined temperature.

In addition, the film formation apparatus 10 can also form nitride films other than a gallium nitride film by using materials other than gallium nitride as the target 130.

[2. Gallium Nitride Film Formation Method]

Figure 3:
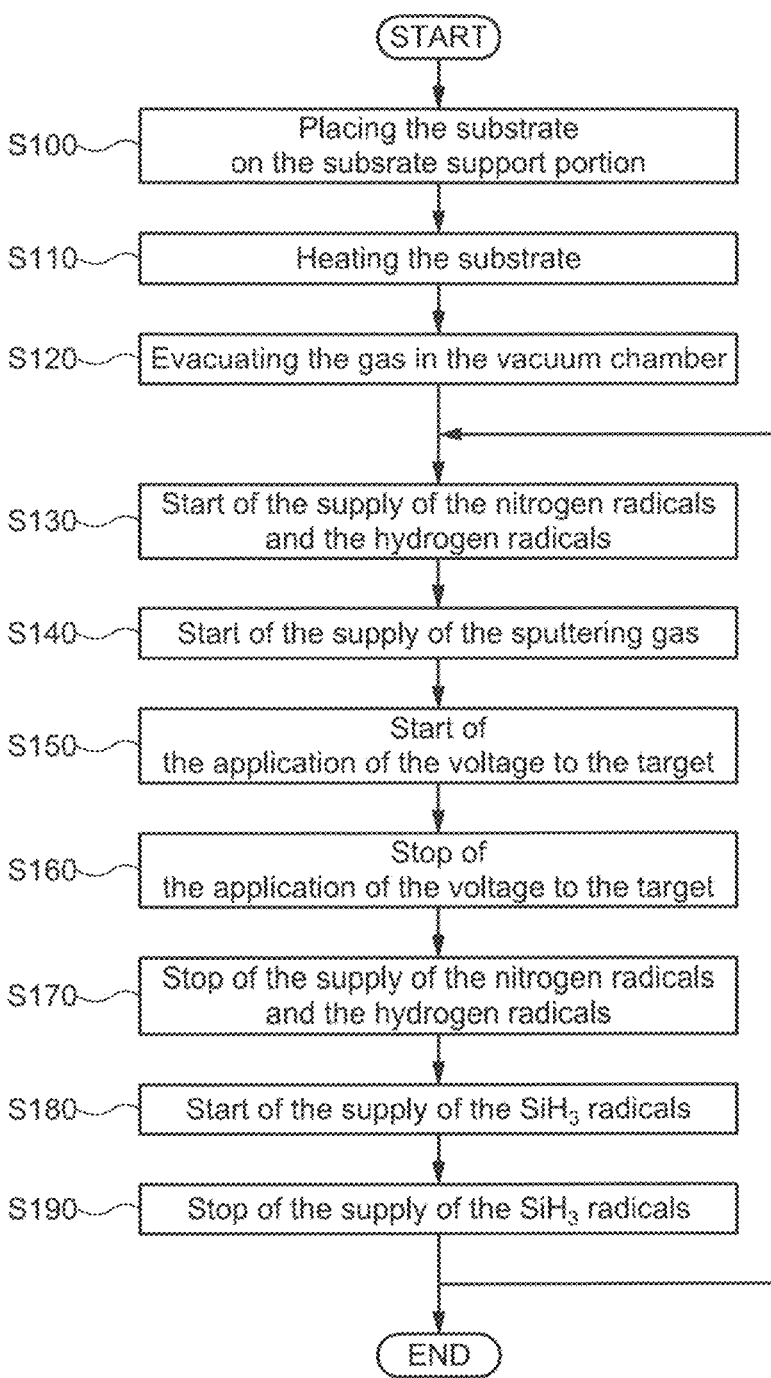
FIG. 3 is a flow chart showing a method for forming a gallium nitride film using a film formation apparatus according to an embodiment of the present invention.

FIG. 3 is a flow chart showing a method for forming a gallium nitride film using the film formation apparatus 10 according to an embodiment of the present invention. In the method for forming the gallium nitride film shown in FIG. 3, steps S100 to S190 are sequentially performed.

In step S100, the substrate is placed on the substrate support portion 110 so as to face the target 130. In the film formation apparatus 10, a glass substrate or a quartz substrate can be used as the substrate, for example. Further, a glass substrate or a quartz substrate on which a titanium film or an aluminum nitride film is formed can be used as the substrate.

In step S110, the substrate is heated at a predetermined temperature by the heating unit 120. For example, the predetermined temperature is greater than or equal to 400° C. and less than or equal to 600° C.

In step S120, the pump 150 evacuates the gas in the vacuum chamber 100 so as to be less than or equal to a predetermined degree of vacuum. For example, although the predetermined degree of vacuum is $1 \times 10^{-6}$ Pa, the predetermined degree of vacuum is not limited thereto.

In step S130, the first radical supply source 180 is controlled to supply the nitrogen radicals and the hydrogen radicals from the first radical supply source 180 to the vacuum chamber 100.

In step S140, the sputtering gas supply unit 170 is controlled to supply the sputtering gas from the sputtering gas supply unit 170 to the vacuum chamber 100. The flow rate of the sputtering gas is adjusted by the mass flow controller 172 so that the pressure in the vacuum chamber 100 becomes a predetermined pressure. For example, the predetermined pressure is greater than or equal to 0.1 Pa and less than or equal to 10 Pa.

In step S150, the sputtering power supply 160 is controlled to start applying a predetermined voltage to the target 130 so that the target 130 becomes a cathode relative to the substrate (the sputtering power supply 160 is in the on-state). In this way, the sputtering gas supplied to the vacuum chamber 100 is turned into a plasma to generate positive ions and electrons of the sputtering gas. The ions of the sputtering gas are accelerated by the potential difference between the substrate and the target 130 and collide with the target 130. As a result, sputtered gallium and gallium positive ions are released from the target 130.

In step S150, the nitrogen radicals are supplied from the first radical supply source 180 to the vacuum chamber 100. Therefore, the gallium released from the target 130 recombines and reacts with the nitrogen radical to generate gallium nitride. The generated gallium nitride is deposited on the substrate to form a gallium nitride film.

Further, in step S150, gallium nitride is generated by another recombination reaction. Nitrogen has a large electronegativity and easily attracts an electron. Therefore, the nitrogen radical reacts with an electron in the vacuum chamber 100 to generate a nitrogen anion. The generated nitrogen anion recombines and reacts with the gallium cation present close to the substrate to generate gallium nitride. The generated gallium nitride is deposited on the substrate to form a gallium nitride film. The recombination reaction of the cation and the anion is a reaction that releases a large amount of thermal energy. Therefore, a high-quality gallium nitride film can be formed on the substrate by adding the thermal energy due to the recombination reaction even when the temperature of the substrate is low.

In addition, oxygen may remain in the vacuum chamber 100. In this case, the gallium cation reacts with the residual oxygen in the vacuum chamber 100 to generate gallium oxide. When gallium oxide is generated, the growth of the gallium nitride film is inhibited. Therefore, it is preferable that the residual oxygen in the vacuum chamber 100 is reduced as much as possible. In step S150, not only the nitrogen radicals but also the hydrogen radicals are supplied to the vacuum chamber 100. The hydrogen radicals react with the residual oxygen to generate water (water vapor). The generated water vapor is exhausted from the vacuum chamber 100 by the pump 150. That is, since the residual oxygen in the vacuum chamber 100 is reduced in the film formation apparatus 10, the generation of gallium oxide is suppressed, so that the gallium nitride film formed on the substrate is a high-quality film.

As described above, the hydrogen radicals have the effect of removing residual oxygen that inhibits the generation of gallium nitride. Further, the hydrogen radical may react with the gallium cation to generate a gallium hydride cation. The gallium hydride cation is highly reactive and easily reacts with the nitrogen anion to generate gallium nitride. Therefore, the hydrogen radicals also have the effect of promoting the generation of gallium nitride.

In step S160, the sputtering power supply 160 is controlled so that the application of the voltage to the target 130 is stopped (the sputtering power supply 160 is in the off-state). In this way, although the plasma disappears, the film formation apparatus 10 can generate gallium nitride even in this state. Specifically, in step S160, gallium nitride can be generated using a metastable state of the sputtering gas (rare gas). Here, the generation of gallium nitride in step S160 is described in detail.

It is known that a rare gas atom in a metastable state with a long lifetime exists in the plasma of the rare gas. For example, metastable energies of an argon atom and a krypton atom are 11.61 eV and 9.91 eV, respectively. Such metastable argon or krypton atoms are generated in the plasma of sputtering, and can exist even after the plasma disappears due to their long lifetime. That is, the metastable argon or krypton atoms can exist even after the application of the voltage to the target 130 is stopped.

After the application of the voltage to the target 130 is stopped, not only the nitrogen radicals but also nitrogen molecules are present in the vacuum chamber 100. The dissociation energy from the nitrogen molecule to the nitrogen atom due to the collision of electrons is 9.756 eV, which is close to the metastable energy of the argon atom or krypton atom. Therefore, when the nitrogen molecule collides with the argon atom or krypton atom in the metastable state, a dissociation reaction of the nitrogen molecule occurs to generate a nitrogen radical. That is, even after the application of the voltage to the target 130 is stopped, the nitrogen radicals are generated by the argon atom or krypton atom in the metastable state. As described above, since the electronegativity of nitrogen is large, the nitrogen radical reacts with an electron in the vacuum chamber 100 to generate a nitrogen anion. Further, in step S160, the nitrogen radicals are supplied from the first radical supply source 180 to the vacuum chamber 100. The supplied nitrogen radical reacts with the electron in the vacuum chamber 100 to generate a nitrogen anion. Thereafter, the nitrogen anion recombines with the gallium cation present close to the substrate to generate gallium nitride, which is deposited on the substrate to form a gallium nitride film.

Therefore, in step S160, by using not only the nitrogen radicals supplied from the first radical supply source 180 but also the argon atoms or krypton atoms in a metastable state, gallium nitride can be generated efficiently.

In step S170, the first radical supply source 180 is controlled so that the supply of the nitrogen radicals and the hydrogen radicals to the vacuum chamber 100 is stopped.

In step S180, the second radical supply source 190 is controlled to supply the SiH₃ radicals from the second radical supply source 190 to the vacuum chamber 100. The SiH₃ radical reacts with the gallium nitride film formed on the substrate, and silicon is added into the gallium nitride film. The SiH₃ radicals have a long lifetime. Further, in step S180, the N₂ gas or the nitrogen radicals are not supplied to the vacuum chamber 100. Therefore, the mean free path of the SiH₃ radicals in the vacuum chamber 100 is large, and they can react efficiently with the gallium nitride film on the substrate. That is, silicon can be efficiently added into the gallium nitride film.

Further, in the second radical supply source 190, not only the SiH₃ radicals but also the hydrogen radicals are generated. Therefore, in step S180, the hydrogen radicals react with the residual oxygen, and the residual oxygen in the vacuum chamber 100 can be further reduced. Furthermore, the hydrogen radicals can reduce the gallium oxide in the vicinity of the surface of the gallium nitride film. Therefore, the reaction of SiH₃ with gallium oxide is suppressed, and silicon can be efficiently doped into the gallium nitride film.

In step S190, the second radical supply source 190 is controlled so that the supply of the SiH₃ radicals to the vacuum chamber 100 is stopped.

A high-quality gallium nitride film doped with silicon can be formed on the substrate by repeating steps S130 to S190. Here, the details of a timing of control by the control unit 200 are described with reference to FIG. 4.

Figure 4:
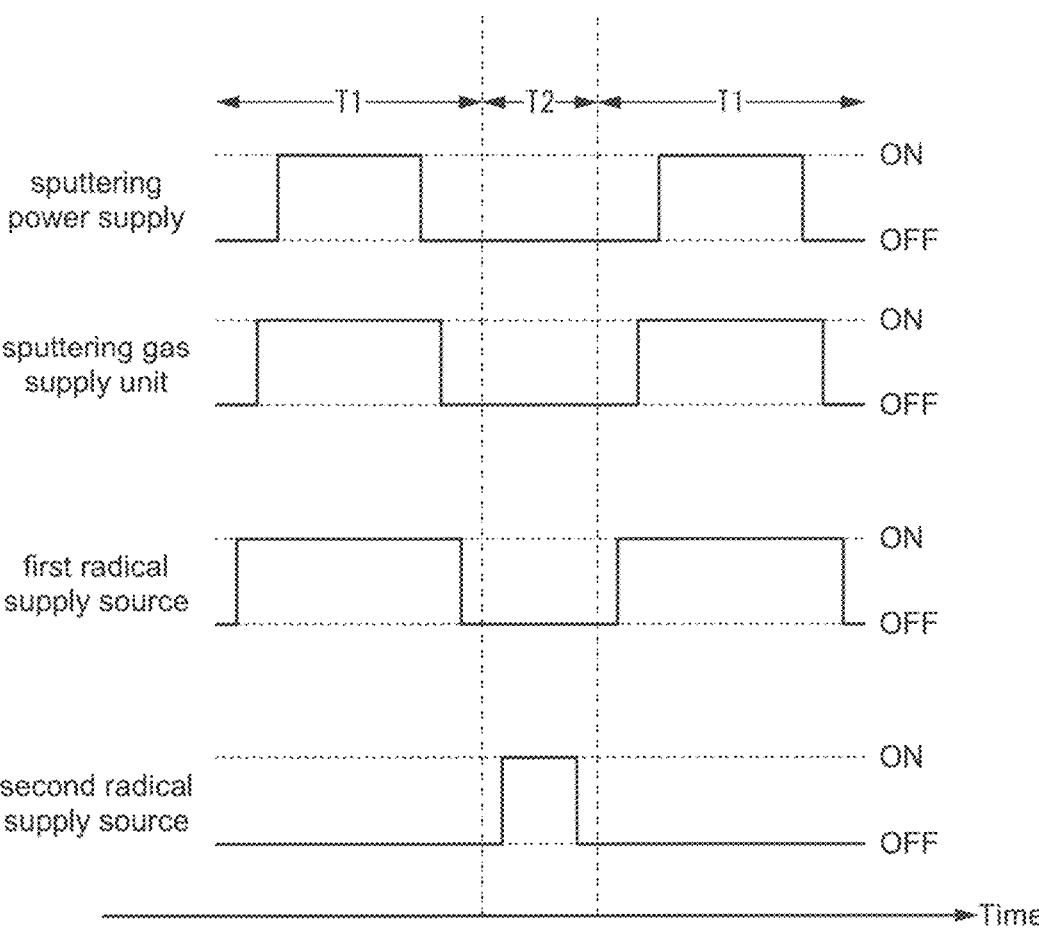
FIG. 4 is a sequence diagram showing a method for forming a gallium nitride film using a film formation apparatus according to an embodiment of the present invention.

FIG. 4 is a sequence diagram showing the method for forming a gallium nitride film using the film formation apparatus 10 according to an embodiment of the present invention.

FIG. 4 shows a first period T1 for forming a gallium nitride film and a second period T2 for adding silicon into the gallium nitride film. In the film formation apparatus 10, the first period T1 and the second period T2 are repeated to form a gallium nitride film doped with an n-type dopant.

Since the second period T2 is a period for adding the n-type dopant into the gallium nitride film, the second period T2 may be shorter than the first period T1.

In the first period T1, the supply of the nitrogen radicals and the hydrogen radicals is started, and then the supply of sputtering gas is started. Thereafter, the sputtering power supply 160 is turned on to form a gallium nitride film. Further, in the first period T1, the sputtering power supply 160 is turned off, and then the supply of the sputtering gas is stopped. Thereafter, the supply of the nitrogen radicals and the hydrogen radicals is stopped.

The supply of the nitrogen radicals and the supply of the hydrogen radicals in the first period T1 may be started or stopped at the same time or different times. Here, a case where the supply of the nitrogen radicals and the supply of the hydrogen radicals are started or stopped at the same time and some cases where the supply of the nitrogen radicals and the supply of the hydrogen radicals are started or stopped at different times are described with reference to FIGS. 5 to 7.

Figure 5:
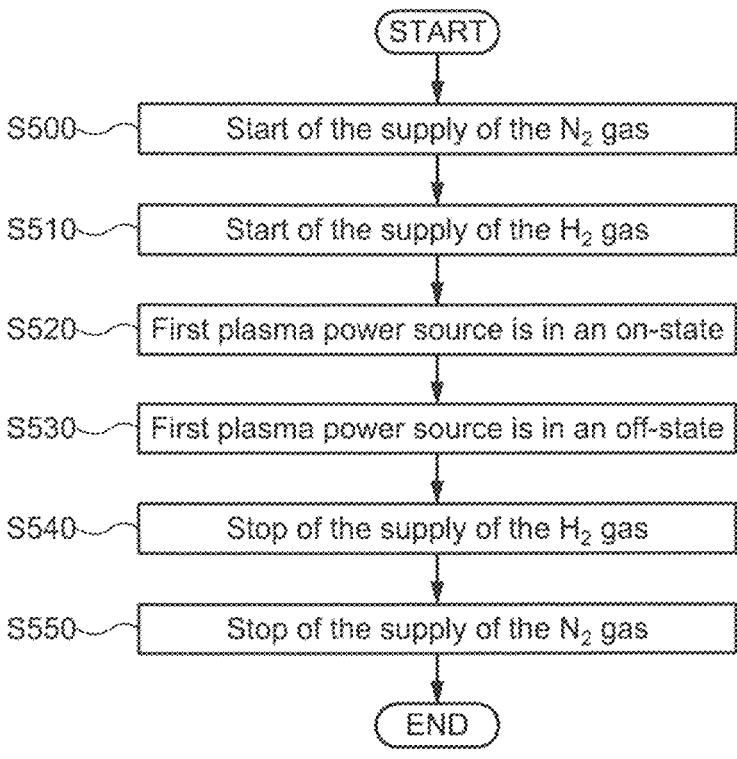
FIG. 5 is a flow chart showing a method for forming a gallium nitride film using a film formation apparatus according to an embodiment of the present invention, in which a supply of nitrogen radicals and a supply of hydrogen radicals are started or stopped at the same time.

FIG. 5 is a flow chart showing the method for forming a gallium nitride film using the film formation apparatus 10 according to an embodiment of the present invention, in which the supply of the nitrogen radicals and the supply of the hydrogen radicals are started or stopped at the same time. As shown in FIG. 5, steps S500 to S550 are sequentially performed.

In step S500, the supply of the N₂ gas is started from the nitrogen gas supply unit 182 to the first radical supply source 180. At this time, the N₂ gas supplied to the first radical supply source 180 may be supplied to the vacuum chamber 100.

In step S510, the supply of the H₂ gas from the hydrogen gas supply unit 183 to the first radical supply source 180 is started. At this time, the H₂ gas supplied to the first radical supply source 180 can also be supplied to the vacuum chamber 100.

In step S520, the first plasma power source 186 is turned on to generate the nitrogen radicals and the hydrogen radicals from the N₂ gas and the H₂ gas supplied to the first radical supply source 180, respectively. In this way, the nitrogen radicals and the hydrogen radicals are generated at the same time, and the generated nitrogen radicals and hydrogen radicals can be supplied to the vacuum chamber 100 at the same time.

In step S530, the first plasma power source 186 is turned off, and then the supply of the nitrogen radicals and the supply of the hydrogen radicals to the vacuum chamber 100 are stopped. At this time, the N₂ gas and the H₂ gas supplied to the first radical supply source 180 can also be supplied to the vacuum chamber 100.

In step S540, the supply of the H₂ gas from the hydrogen gas supply unit 183 to the first radical supply source 180 is stopped.

In step S550, the supply of the N₂ gas from the nitrogen gas supply unit 182 to the first radical supply source 180 is stopped.

Figure 6:
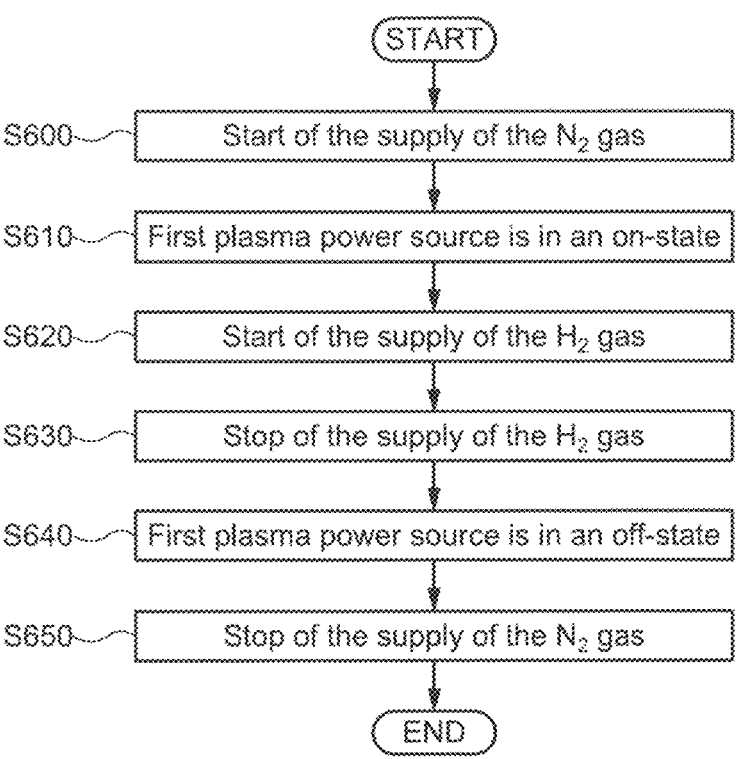
FIG. 6 is a flow chart showing a method for forming a gallium nitride film using a film formation apparatus according to an embodiment of the present invention, in which a supply of nitrogen radicals and a supply of hydrogen radicals are started or stopped at different times.
Figure 7:
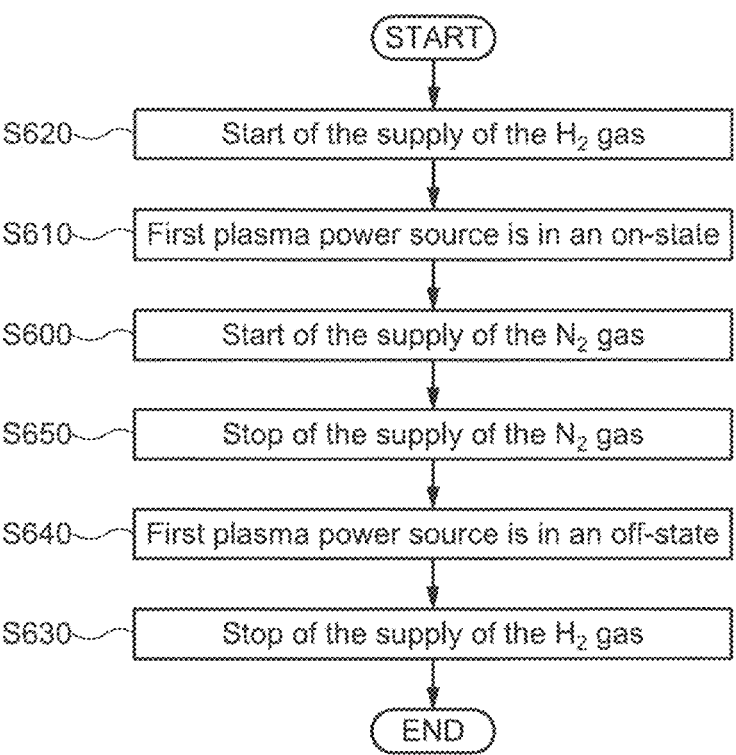
FIG. 7 is a flow chart showing a method for forming a gallium nitride film using a film formation apparatus according to an embodiment of the present invention, in which a supply of nitrogen radicals and a supply of hydrogen radicals are started or stopped at different times.

FIGS. 6 and 7 are flow charts showing the method for forming a gallium nitride film using the film formation apparatus 10 according to an embodiment of the present invention, in which the supply of nitrogen radicals and the supply of hydrogen radicals are started or stopped at different times. As shown in FIGS. 6 and 7, steps S600 to S650 are included.

In step S600, the supply of the N₂ gas from the nitrogen gas supply unit 182 to the first radical supply source 180 is started. At this time, the $N_2$ gas supplied to the first radical supply source 180 may be supplied to the vacuum chamber 100.

In step S610, the first plasma power source 186 is turned on to generate the nitrogen radicals from the $N_2$ gas supplied to the first radical supply source 180. The generated nitrogen radicals are supplied to the vacuum chamber 100. In addition, the hydrogen radicals have not been supplied to the vacuum chamber 100 at this time.

In step S620, the supply of the $H_2$ gas from the hydrogen gas supply unit 183 to the first radical supply source 180 is started. Further, the hydrogen radicals are generated from the $H_2$ gas supplied to the first radical source 180. The generated hydrogen radicals are supplied to the vacuum chamber 100. In this way, the hydrogen radicals can be supplied to the vacuum chamber 100 at a timing different from that of the nitrogen radicals.

In step S630, the supply of the $H_2$ gas from the hydrogen gas supply unit 183 to the first radical supply source 180 is stopped. In this way, the supply of the hydrogen radicals to the vacuum chamber 100 is stopped. In addition, the nitrogen radicals have been supplied to the vacuum chamber 100 at this time.

In step S640, the first plasma power source 186 is turned off, and then the supply of the nitrogen radicals to the vacuum chamber 100 is stopped. In this way, the supply of the nitrogen radicals to the vacuum chamber 100 can be stopped at a timing different from that of the hydrogen radicals. In addition, the $N_2$ gas supplied to the first radical supply source 180 can also be supplied to the vacuum chamber 100.

In step S640, the supply of the $N_2$ gas from the nitrogen gas supply unit 120 to the first radical supply source 180 is stopped.

The timing of the start and stop of the supply of the $N_2$ gas and the start and stop of the supply of the $H_2$ gas in the flow chart shown in FIG. 7 is reversed to that in the flow chart shown in FIG. 6. Since the other configurations are the same, the description of the flow chart shown in FIG. 7 is omitted.

The second period T2 is described returning to FIG. 4.

In the second period T2, the $SiH_3$ radicals are supplied from the second radical supply source 190 to the vacuum chamber 100. At this time, the nitrogen radicals have not been supplied from the first radical supply source 180 to the vacuum chamber 100. Therefore, since the reaction between the $SiH_3$ radical and the nitrogen radical does not occur, the $SiH_3$ radicals can react efficiently with the gallium nitride film on the substrate to add silicon into the gallium nitride film. Then, the supply of the $SiH_3$ radicals from the second radical supply source 190 to the vacuum chamber 100 is stopped. The supply period of the $SiH_3$ radicals is greater than or equal to 1 μsec and less than or equal to 100 μsec.

As described above, in the film formation apparatus 10, a gallium nitride film is formed on the substrate using the nitrogen radicals and the hydrogen radicals from the first radical supply source 180 in the first period T1, and then silicon is added into the gallium nitride film on the substrate using the $SiH_3$ radicals from the second radical supply source 190 in the second period T2. In the second period T2, since the nitrogen radicals are not in the vacuum chamber 100, the $SiH_3$ radicals can react efficiently with the gallium nitride film. Therefore, in the film formation apparatus 10, the controllability of the n-type dopant in the gallium nitride film is improved.

<Modification 1>

The film formation apparatus 10 is not limited to the configuration shown in FIG. 1. Hereinafter, a configuration of a film formation apparatus 10A, which is a modification of the film formation apparatus 10, is described with reference to FIG. 8. In addition, when the configuration of the film formation apparatus 10A is similar to that of the film formation apparatus 10, the description of the configuration of the film formation apparatus 10A may be omitted.

Figure 8:
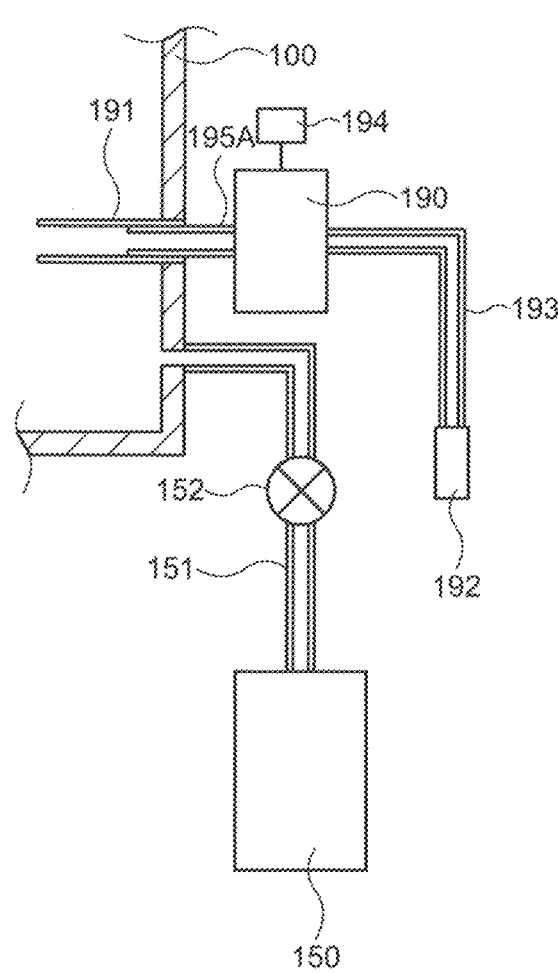
FIG. 8 is a schematic diagram showing a part of a configuration of a film formation apparatus according to an embodiment of the present invention.

FIG. 8 is a schematic diagram showing a part of the configuration of the film formation apparatus 10A according to an embodiment of the present invention.

As shown in FIG. 8, an expandable pipe 195A is provided between the second radical supply source 190 and the pipe 191. The $SiH_3$ radicals generated in the second radical supply source 190 are supplied to the vacuum chamber 100 through the pipe 195A and the pipe 191. When the length of the pipe 195A is increased, the $SiH_3$ radicals are easily deactivated in the pipe 195A and the pipe 191. Therefore, the amount of the $SiH_3$ radicals supplied to the vacuum chamber 100 is reduced. That is, the amount of the $SiH_3$ radicals reaching the substrate can be adjusted by changing the length of the pipe 195A.

The pipe 195A may be a pipe that expands and contracts so as to slide relative to the pipe 191, or may be a bellows pipe.

As described above, in the film formation apparatus 10A, the amount of the $SiH_3$ radicals supplied to the vacuum chamber 100 can be adjusted by changing the distance from the second radical supply source 190 to one end of the pipe 191 in the vacuum chamber 100. In this way, the amount of the n-type dopant added into the gallium nitride film can be controllably adjusted. Therefore, in the film formation apparatus 10A, the controllability of the n-type dopant in the gallium nitride film is improved.

<Modification 2>

The timing of control by the control unit 200 is not limited to the configuration shown in FIG. 4. Another timing of control by the control unit 200 is described with reference to FIG. 9. In addition, when the configuration shown in FIG. 9 is similar to the configuration shown in FIG. 4, the description of the configuration shown in FIG. 9 may be omitted.

Figure 9:
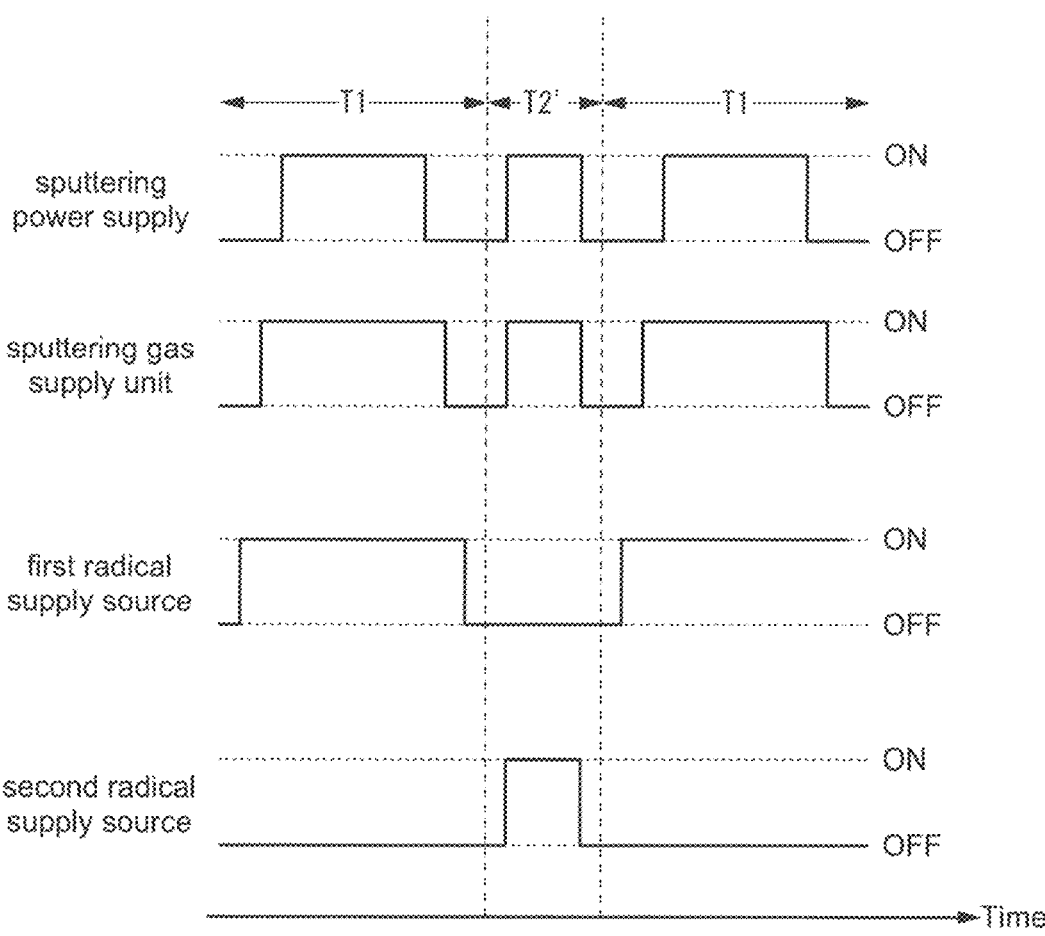
FIG. 9 is a sequence diagram showing a method for forming a gallium nitride film using a film formation apparatus according to an embodiment of the present invention.

FIG. 9 is a sequence diagram showing the method for forming a gallium nitride film using the film formation apparatus 10 according to an embodiment of the present invention.

As shown in FIG. 9, in the second period T2', the $SiH_3$ radicals are supplied from the second radical supply source 190 to the vacuum chamber 100, the sputtering gas is supplied, and the sputtering power supply 160 is turned on. In this case, although gallium nitride is sputtered from the target, the nitrogen radicals are not supplied to the vacuum chamber 100, so that gallium nitride containing more gallium than nitrogen is deposited on the substrate. Therefore, since a gallium plane is dominant on the surface of the gallium nitride film on the substrate, the $SiH_3$ radicals react with gallium on the gallium plane, so that gallium of the gallium plane is replaced with silicon. Therefore, silicon can be efficiently added into the gallium nitride film. In this case, the silicon concentration in the gallium nitride film changes periodically in the film thickness direction.

It is not necessary that gallium nitride is actively sputtered in the second period T2'. Therefore, it is preferable that the power of the sputtering power supply 160 in the second period T2' is smaller than the power of the sputtering power supply 160 in the first period T1.

As described above, by sputtering gallium nitride without supplying the nitrogen radicals in the second period T2', the n-type dopant can be efficiently added into the gallium nitride film, so that the controllability of the n-type dopant is improved.

<Modification 3>

The gallium plane on the surface of the gallium nitride on the substrate may be formed during a period other than the second period T2'. Another timing of control by the control unit 200 is described with reference to FIG. 10. When the configuration shown in FIG. 10 is similar to the configuration shown in FIG. 4 or FIG. 9, the description of the configuration shown in FIG. 10 may be omitted.

Figure 10:
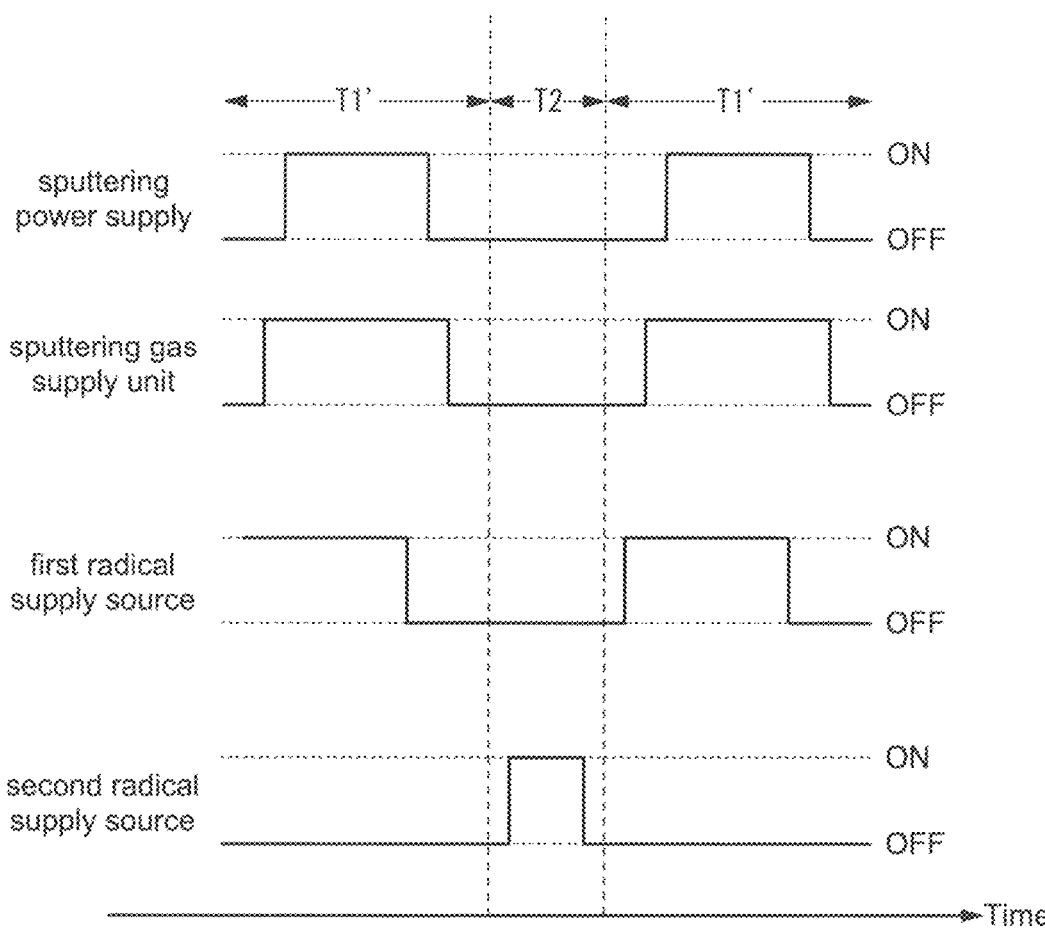
FIG. 10 is a sequence diagram showing a method for forming a gallium nitride film using a film formation apparatus according to an embodiment of the present invention.

FIG. 10 is a sequence diagram showing the method for forming a gallium nitride film using the film formation apparatus 10 according to an embodiment of the present invention.

As shown in FIG. 10, in the first period T1', the supply of the nitrogen radicals and the supply of the hydrogen radicals from the first radical supply source 180 are stopped, and then the sputtering power supply is turned off. Therefore, the first period T1' includes a period in which gallium nitride is sputtered from the target even after the supply of the nitrogen radicals and the supply of the hydrogen radicals are stopped. Since the nitrogen radicals are not supplied to the vacuum chamber 100 during this period, gallium nitride containing more gallium than nitrogen is deposited on the substrate. That is, a gallium plane is dominant on the surface of the gallium nitride film on the substrate. Subsequently, when the $SiH_3$ radicals are supplied to the vacuum chamber 100 in the second period T2, the $SiH_3$ radicals react with gallium on the gallium plane formed in the first period T1', so that gallium of the gallium plane is replaced with silicon. Therefore, silicon can be efficiently added into the gallium nitride film.

As described above, a gallium nitride film having a gallium plane on its surface is formed in the first period T1', and gallium on the gallium plane is reacted with the $SiH_3$ radicals in the second period T2, thereby efficiently adding the n-type dopant into the gallium nitride film and improving the controllability of the n-type dopant.

<Modification 4>

The doping gas supplied from the doping gas supply unit 192 is not limited to the $SiH_4$ gas. A doping gas ($SiH_4/XeF_2$ mixed gas) in which the $XeF_2$ gas is added to the $SiH_4$ gas may be used. The $XeF_2$ forms metastable Xe* and F radicals by collision with electrons. The energy of metastable Xe* is 8.32 eV. This value is close to the dissociation energy of $SiH_4$ of 8.75 eV. Therefore, the $SiH_3$ radicals are selectively generated from metastable Xe* in the second radical supply source 190. Further, the F radical has a large electronegativity and can extract hydrogen from $SiH_4$. Therefore, the $SiH_3$ radicals are selectively generated from the F radicals in the second radical supply source 190.

$$XeF_2 + e \rightarrow Xe^* + 2F + e$$

$$SiH_4 + Xe^* \rightarrow SiH_3 + Xe + H$$

$$SiH_4 + F \rightarrow SiH_3 + HF$$

As described above, by using the doping gas in which the $XeF_2$ gas is added to the $SiH_4$ gas, the $SiH_3$ radicals can be efficiently generated in the second radical supply source 190. Therefore, the n-type dopant can be efficiently added into the gallium nitride film, and the controllability of the n-type dopant is improved.

<Modification 5>

A doping gas ($SiH_4/SiH_2Cl_2$ mixed gas) in which the $SiH_2Cl_2$ gas is added to the $SiH_4$ gas may be used as the doping gas supplied from the doping gas supply unit 192. In this case, not only the $SiH_3$ radicals but also Cl radicals are generated in the second radical supply source 190. The Cl radical has a large electronegativity and can extract hydrogen from $SiH_4$. Therefore, the $SiH_3$ radicals are selectively generated from Cl radicals in the second radical supply source 190. In addition, although $SiH_2$ radicals are also generated, the $SiH_2$ radicals have a shorter lifetime than the $SiH_3$ radicals, so that the $SiH_2$ radicals are deactivated by other reactions in the second radical supply source 190. Therefore, the $SiH_3$ radicals are mainly supplied from the second radical supply source 190 to the vacuum chamber 100.

$$SiH_2Cl_2 + e \rightarrow SiH_2 + 2Cl + e$$

$$SiH_4 + Cl \rightarrow SiH_3 + HCl$$

As described above, by using the doping gas in which the $SiH_2Cl_2$ gas is added to the $SiH_4$ gas, the $SiH_3$ radicals can be efficiently generated in the second radical supply source 190. Therefore, the n-type dopant can be efficiently added into the gallium nitride film, and the controllability of the n-type dopant is improved. Further, the Cl radicals may be supplied to the vacuum chamber 100. The Cl radicals supplied to the vacuum chamber 100 can etch the amorphous region of the gallium nitride film on the substrate. In this way, the crystallinity of the gallium nitride film can be improved.

Second Embodiment

A gallium nitride film formation apparatus 20 according to an embodiment of the present invention is described with reference to FIGS. 11 to 13. Hereinafter, when the configuration of the film formation apparatus 20 is similar to that of the film formation apparatus 10, the description of the configuration of the film formation apparatus 20 may be omitted.

[1. Configuration of Film Formation Apparatus 20]

Figure 11:
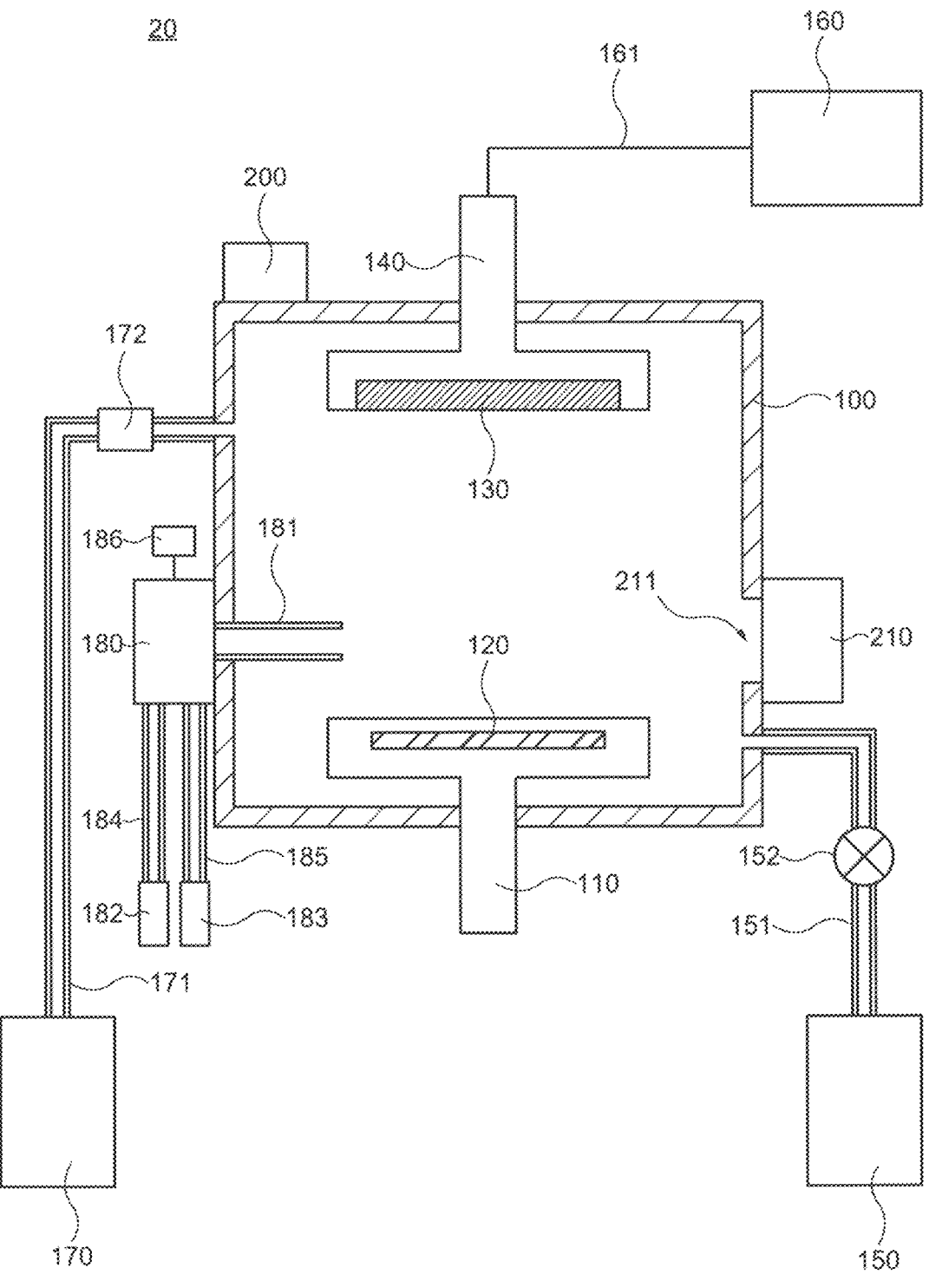
FIG. 11 is a schematic diagram showing a configuration of a film formation apparatus according to an embodiment of the present invention.

FIG. 11 is a schematic diagram showing the configuration of the film formation apparatus 20 according to an embodiment of the present invention. Mainly, a gallium nitride film containing a p-type dopant can be formed using the film formation apparatus 20. Hereinafter, for convenience, the configuration of the film formation apparatus 20 is described assuming that the p-type dopant of the gallium nitride film is magnesium. However, the p-type dopant is not limited to magnesium.

As shown in FIG. 11, the film formation apparatus 10 includes the vacuum chamber 100, the substrate support portion 110, the heating unit 120, the target 130, the target support portion 140, the pump 150, the sputtering power supply 160, the sputtering gas supply unit 170, the first radical supply source 180, a dopant supply source 210, and the control unit 200.

The dopant supply source 210 includes a target and a device such as sputtering or electron beam evaporation, and can supply magnesium contained in the target to the vacuum chamber 100. When the dopant supply source 210 includes a sputtering device, a cathode electrode may be provided in the vacuum chamber 100. When the dopant supply source 210 includes a facing target sputtering device, power is applied between two facing targets. In this way, magnesium sputtered in a direction approximately horizontal to the targets is supplied to the vacuum chamber 100. When the dopant supply source 210 includes an electron beam evaporation device, magnesium evaporated in a direction approximately vertical to the target is supplied to the vacuum chamber 100.

Magnesium from the dopant supply source 210 is supplied to the vacuum chamber 100 through an opening 211 provided in the vacuum chamber 100. A shutter that changes the area of the opening 211 may be provided between the vacuum chamber 100 and the dopant supply source 210 in order to adjust the amount of magnesium supplied to the vacuum chamber 100. The shutter may be controlled by the control unit 200. In this way, magnesium can be supplied to the vacuum chamber 100 while controlling the amount of magnesium. Further, the amount of magnesium can be controlled by adjusting the distance from the target of the dopant supply source 210 to the opening 211.

[2. Gallium Nitride Film Formation Method]

Figure 12:
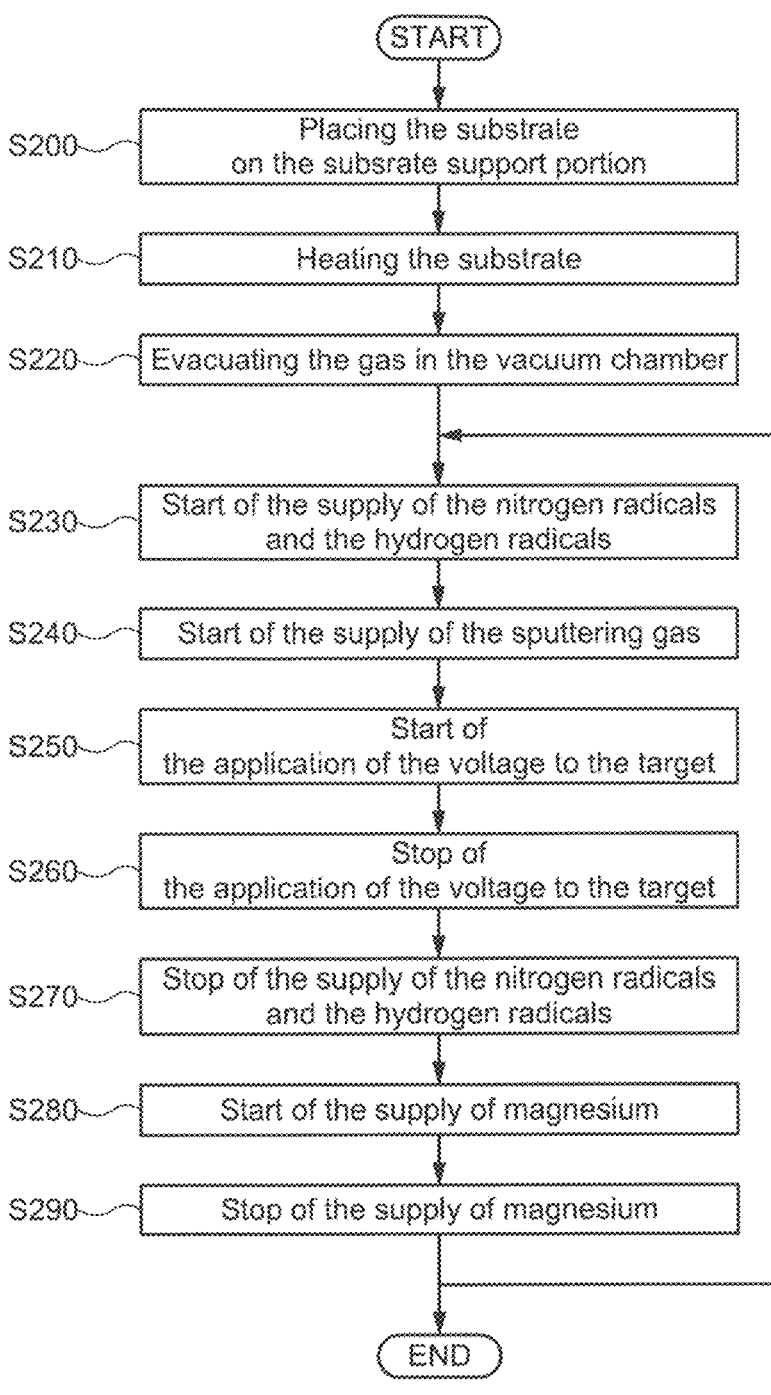
FIG. 12 is a flow chart showing a method for forming a gallium nitride film using a film formation apparatus according to an embodiment of the present invention.

FIG. 12 is a flow chart showing a method for forming a gallium nitride film using the film formation apparatus 20 according to an embodiment of the present invention. In the method for forming the gallium nitride film shown in FIG. 12, steps S200 to S290 are sequentially performed.

Since steps S200 to S270 are similar to steps S100 to S170 described in the First Embodiment, respectively, the descriptions of steps S200 to S270 are omitted.

In step S280, the dopant supply source 210 is controlled so that magnesium is supplied from the dopant supply source 210 to the vacuum chamber 100. Magnesium reacts with the gallium nitride film formed on the substrate, and magnesium is added into the gallium nitride film. At this time, the $N_2$ gas or the nitrogen radicals are not supplied to the vacuum chamber 100. Therefore, magnesium can be efficiently added into the gallium nitride film without reacting with the $N_2$ gas or the nitrogen radicals.

A gallium nitride film doped with magnesium can be formed on the substrate by repeating steps S230 to S290. Here, the details of a timing of control by the control unit 200 are described with reference to FIG. 13.

Figure 13:
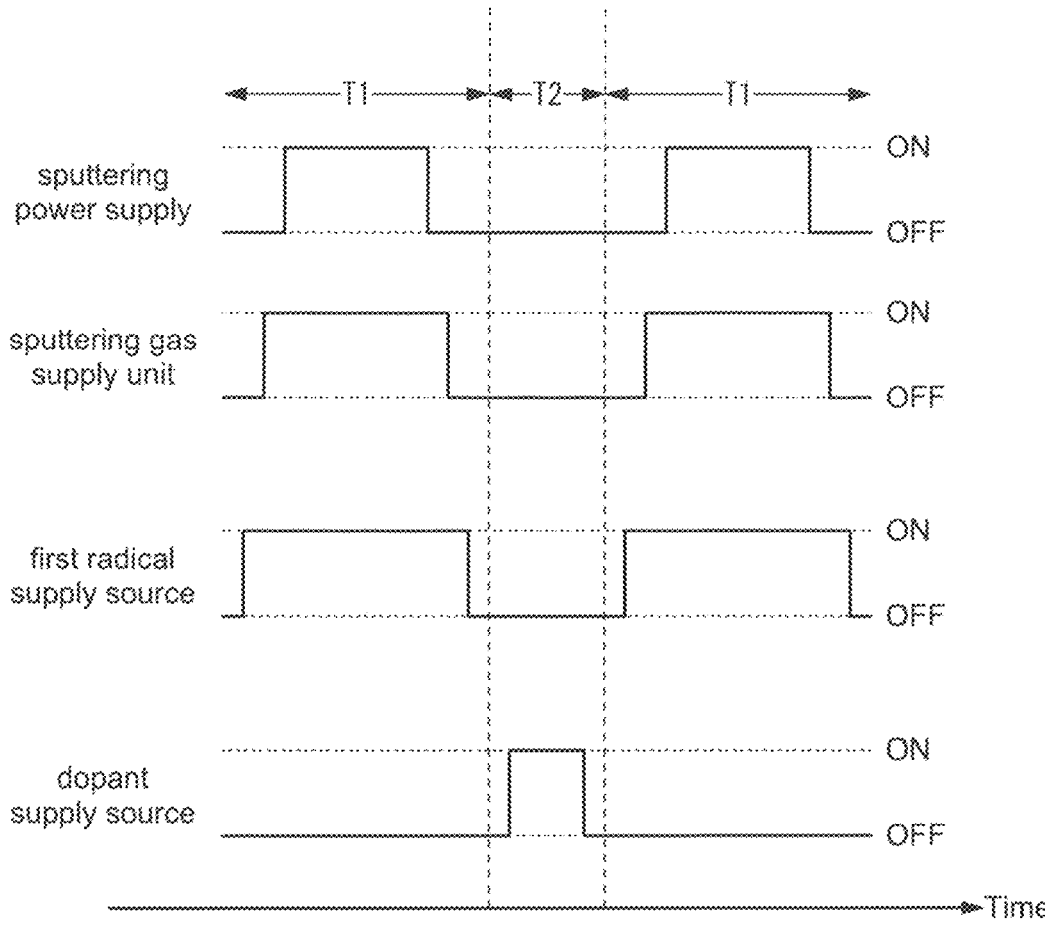
FIG. 13 is a sequence diagram showing a method for forming a gallium nitride film using a film formation apparatus according to an embodiment of the present invention.

FIG. 13 is a sequence diagram showing the method for forming a gallium nitride film using the film formation apparatus 20 according to an embodiment of the present invention.

FIG. 13 shows a first period T1 for forming a gallium nitride film and a second period T2 for adding magnesium into the gallium nitride film. In the film formation apparatus 20, the first period T1 and the second period T2 are repeated to form a gallium nitride film doped with a p-type dopant.

In the first period T1, the supply of the nitrogen radicals and the hydrogen radicals is started, and then the supply of the sputtering gas is started. Thereafter, the sputtering power supply 160 is turned on to form a gallium nitride film. Further, in the first period T1, the sputtering power supply 160 is turned off, and then the supply of the sputtering gas is stopped. Thereafter, the supply of the nitrogen radicals and the supply of the hydrogen radicals are stopped.

Since the first period T1 in the present embodiment is similar to the first period T1 described in the First Embodiment, the detailed description of the first period T1 is omitted.

In the second period T2, magnesium is supplied from the second radical supply source 190 to the vacuum chamber 100. At this time, the nitrogen radicals have not been supplied from the first radical supply source 180 to the vacuum chamber 100. Therefore, since no reaction occurs between magnesium and the nitrogen radicals, magnesium reacts efficiently with the gallium nitride film on the substrate, so that magnesium is added into the gallium nitride film. Thereafter, the supply of magnesium from the dopant supply source 210 to the vacuum chamber 100 is stopped.

As described above, in the film formation apparatus 20, a gallium nitride film is formed on a substrate using the nitrogen radicals and the hydrogen radicals from the first radical supply source 180 in the first period T1, and then magnesium is added into the gallium nitride film on the substrate using magnesium from the dopant supply source 210 in the second period T2. In the second period T2, since the nitrogen radicals are not in the vacuum chamber 100, magnesium can react efficiently with the gallium nitride film. Therefore, in the film formation apparatus 20, the controllability of the p-type dopant in the gallium nitride film is improved.

In the film formation apparatus 20, an indium gallium nitride film can be formed by supplying indium from the dopant supply source 210, and an aluminum gallium nitride film can be formed by supplying aluminum from the dopant supply source 210.

Third Embodiment

Figure 14:
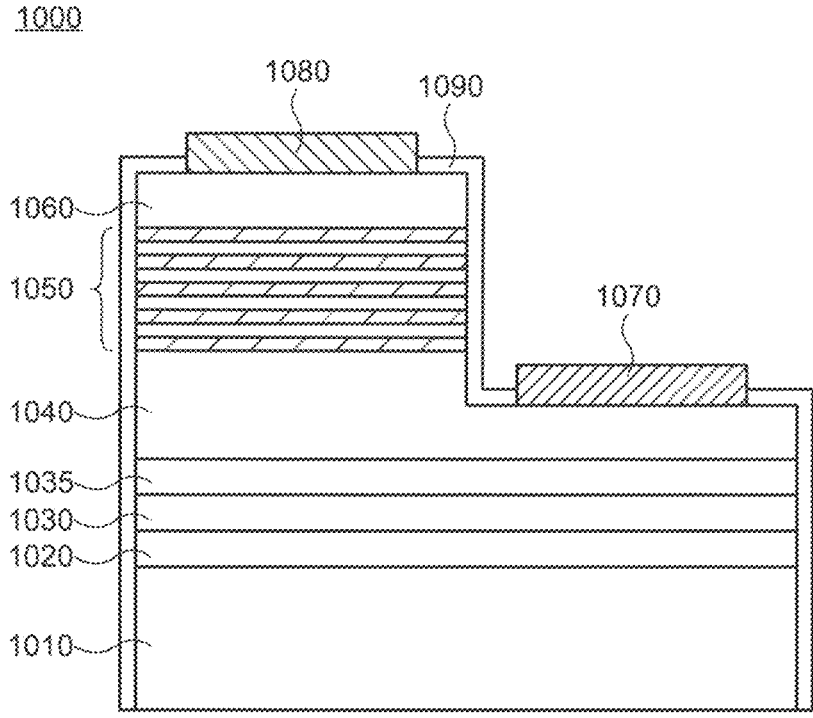
FIG. 14 is a schematic diagram showing a configuration of a light emitting element according to an embodiment of the present invention.

FIG. 14 is a schematic diagram showing a configuration of a light emitting element 1000 according to an embodiment of the present invention.

As shown in FIG. 14, the light emitting element 1000 includes a substrate 1010, a barrier layer 1020, a buffer layer 1030, an undoped semiconductor layer 1035, an n-type semiconductor layer 1040, a light emitting layer 1050, a p-type semiconductor layer 1060, an n-type electrode 1070, a p-type electrode 1080, and a protective layer 1090. Although the light emitting element 1000 is a so-called LED (Light Emitting Diode), the light emitting element 1000 is not limited thereto.

For example, a glass substrate, a quartz substrate, or the like can be used as the substrate 1010. For example, a silicon nitride film or the like can be used as the barrier layer 1020. For example, an aluminum nitride film or the like can be used as the buffer layer 1030. For example, the undoped semiconductor layer 1035 can be a gallium nitride film. For example, a gallium nitride film doped with silicon or the like can be used as the n-type semiconductor layer 1040. For example, a stacked structure in which an indium gallium nitride film and a gallium nitride film are alternately stacked can be used for the light emitting layer 1050. For example, a gallium nitride film doped with magnesium or the like can be used as the p-type semiconductor layer 1060. For example, a metal such as indium can be used as the n-type electrode 1070. For example, a metal such as palladium or gold can be used as the p-type electrode 1080. In the light emitting device 1000 according to the present embodiment, a configuration in which the barrier layer 1020 is not provided may also be applied.

Figure 15:
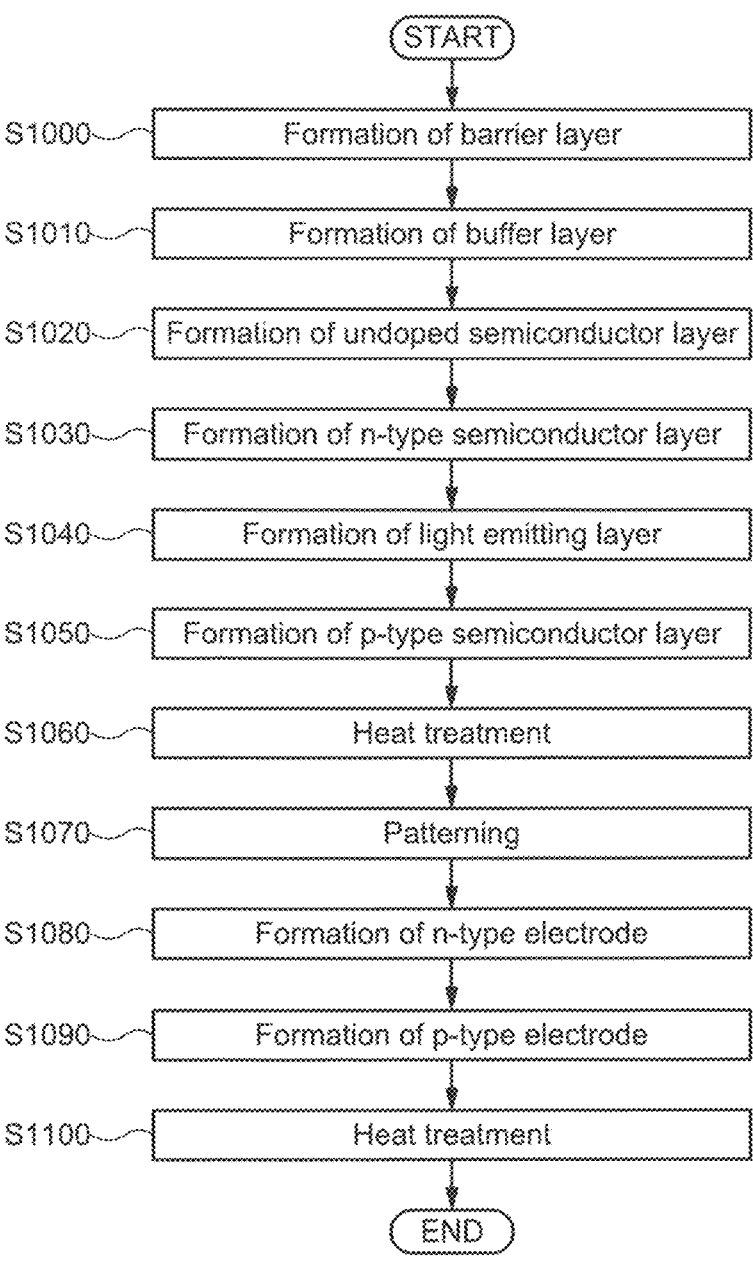
FIG. 15 is a flow chart showing a method for manufacturing a light emitting element according to an embodiment of the present invention.

FIG. 15 is a flow chart showing a method for manufacturing the light emitting device 1000 according to an embodiment of the present invention.

In step S1000, a silicon nitride film is formed on the substrate 1010 as the barrier layer 1020. The silicon nitride film can be formed using a CVD apparatus.

In step S1010, an aluminum nitride film is formed on the barrier layer 1020 as the buffer layer 1030. The aluminum nitride film can be formed by sputtering aluminum nitride used onto the target 130 in the film formation apparatus 10 or the film formation apparatus 20. At this time, the nitrogen radicals and the hydrogen radicals may be supplied from the first radical supply source 180.

In step S1020, a gallium nitride film is formed on the buffer layer 1030 as the undoped semiconductor layer 1035. The gallium nitride film can be formed using the film formation apparatus 10 described in the First Embodiment.

In step S1030, a gallium nitride film doped with silicon is formed on the undoped semiconductor layer 1035 as the n-type semiconductor layer 1040. The gallium nitride film doped with silicon can be formed using the film formation apparatus 10 described in the First Embodiment.

In step S1040, an indium gallium nitride film and a gallium nitride film are alternately formed on the n-type semiconductor layer 1040 as the light emitting layer 1050. The indium gallium nitride film can be formed by using gallium nitride as the target 130 and supplying indium from the dopant supply source 210 in the film formation apparatus 20. That is, the indium gallium nitride film can be formed by providing an indium target in the dopant supply source 210 of the film formation apparatus 20 described in the Second Embodiment. The gallium nitride film can be formed by using gallium nitride as the target 130 and supplying the nitrogen radicals and the hydrogen radicals from the first radical supply source 180 in the film formation apparatus 20. At this time, it is preferable that the oxygen concentration of the light emitting layer 1050 is less than $1 \times 10^{18}$ cm$^{-3}$. In the film formation apparatus 20, since the concentration of residual oxygen in the vacuum chamber 100 can be reduced, the oxygen concentration of the light emitting layer 1050 can be controlled within the above range.

In step S1050, a gallium nitride film doped with magnesium is formed on the light emitting layer 1050 as the p-type semiconductor layer 1060. The gallium nitride film doped with magnesium can be formed using the film formation apparatus 20 described in the Second Embodiment. At this time, it is preferable that the oxygen concentration of the p-type semiconductor layer 1060 is less than $1 \times 10^{18}$ cm$^{-3}$. In the film formation apparatus 20, since the concentration of residual oxygen in the vacuum chamber 100 can be reduced, the oxygen concentration of the p-type semiconductor layer 1060 can be controlled within the above range.

In step S1060, a heat treatment is performed. The activation rate of the magnesium added into the gallium nitride film in step S1050 may be low. In this case, the magnesium can be activated by performing a heat treatment to allow the layer to function as the p-type semiconductor layer 1060.

In step S1070, the p-type semiconductor layer 1060, the light emitting layer 1050, and the n-type semiconductor layer 1040 are etched into a predetermined pattern using photolithography. In addition, the n-type semiconductor layer 1040 is etched so that its surface is exposed (i.e., so that a part of the n-type semiconductor layer 1040 remains). For example, plasma etching can be used as the etching.

In step S1080, a transparent conductive film of ITO is formed on the n-type semiconductor layer 1040 as the n-type electrode 1070.

In step S1090, a metal film of Pd/Au is formed on the p-type semiconductor layer 1060 as the p-type electrode 1080.

In step S1100, a heat treatment is performed. In this way, the contact resistance between the n-type semiconductor layer 1040 and the n-type electrode 1070 and the contact resistance between the p-type semiconductor layer 1060 and the p-type electrode 1080 can be reduced.

In addition, a protective layer 1090 is formed on the upper surface and a sidewall of the light emitting element 1000. The protective layer 1090 may be formed after step S1070 or after step S1090. An opening is formed in the protective layer 1090, and the opening can be formed using photolithography and etching.

As described above, steps S1010 to S1050 can be performed using the film formation apparatus 10 and the film formation apparatus 20 in the manufacture of the light emitting device 1000 according to the present embodiment. Therefore, the light emitting device 1000 can be manufactured using a substrate with low heat resistance, for example, a glass substrate, and the light emitting device 1000 in which the dopants of the n-type semiconductor layer 1040 and the p-type semiconductor layer are controlled can be manufactured.

Fourth Embodiment

Figure 16:
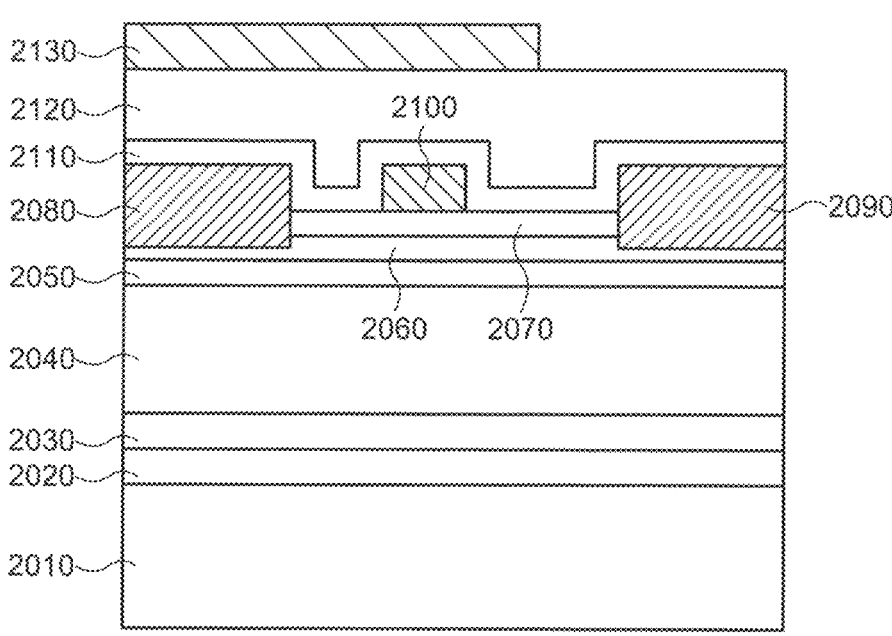
FIG. 16 is a schematic diagram showing a configuration of a semiconductor element according to an embodiment of the present invention.

FIG. 16 is a schematic diagram showing a configuration of a semiconductor device 2000 according to an embodiment of the present invention.

As shown in FIG. 16, the semiconductor device 2000 includes a substrate 2010, a barrier layer 2020, a buffer layer 2030, a gallium nitride layer 2040, a first aluminum gallium nitride layer 2050, a second aluminum gallium nitride layer 2060, a third aluminum gallium nitride layer 2070, a source electrode 2080, a drain electrode 2090, a gate electrode 2100, a first insulating layer 2110, a second insulating layer 2120, and a shield electrode 2130. Although the semiconductor device 2000 is a so-called HEMT (High Electron Mobility Transistor), the semiconductor device 2000 is not limited thereto.

For example, a glass substrate, a quartz substrate, or the like can be used as the substrate 2010. For example, a silicon nitride film or the like can be used as the barrier layer 2020. For example, an aluminum nitride film or the like can be used as the buffer layer 2030. For example, a gallium nitride film can be used as the gallium nitride layer 2040. For example, an aluminum gallium nitride film can be used as the first aluminum gallium nitride layer 2050. For example, a gallium nitride film doped with silicon can be used as the second aluminum gallium nitride layer 2060. For example, an aluminum gallium nitride film can be used as the third aluminum gallium nitride layer 2070. For example, a stacked metal film such as titanium/aluminum (Ti/Al) can used for the source electrode 2080 and the drain electrode 2090. For example, a stacked metal film such as nickel/gold (Ni/Au) can be used for the gate electrode 2100. For example, a silicon nitride film or the like can be used as the first insulating layer 2110. For example, a silicon oxide film or the like can be used as the second insulating layer 2120. For example, a stacked metal such as aluminum/titanium (Al/Ti) can be used for the shield electrode 2130. In addition, in the semiconductor element 2000 according to the present embodiment, a configuration in which the barrier layer 2020 is not provided can also be applied.

Figure 17:
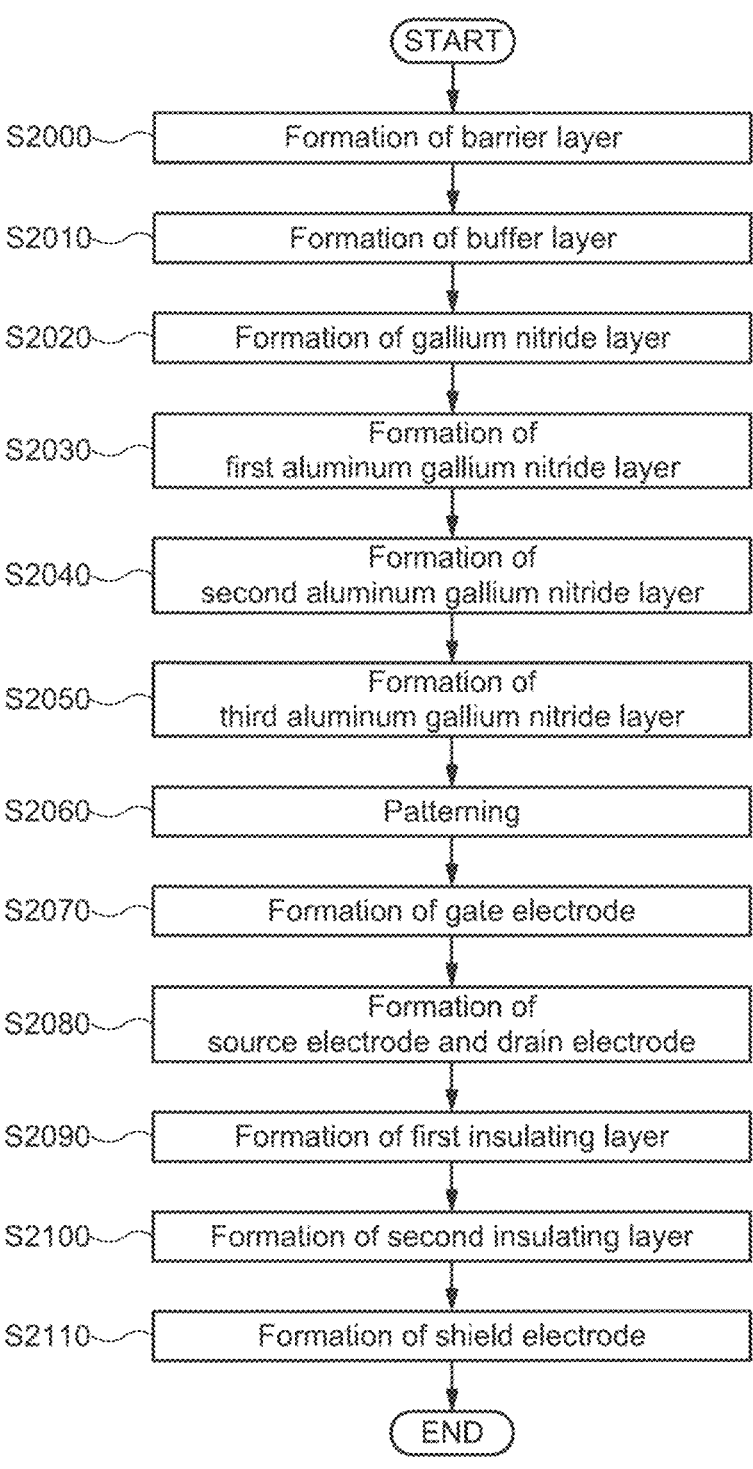
FIG. 17 is a flow chart showing a method for manufacturing a semiconductor element according to an embodiment of the present invention.

FIG. 17 is a flow chart showing a method for manufacturing the semiconductor device 2000 according to an embodiment of the present invention.

In step S2000, a silicon nitride film is formed on the substrate 2010 as the barrier layer 2020.

In step S2010, an aluminum nitride film is formed on barrier layer 2020 as the buffer layer 2030.

In step S2020, a gallium nitride film is formed on the buffer layer 2030 as the gallium nitride layer 2040. The gallium nitride film can be formed in the film formation apparatus 10 or the film formation apparatus 20 by using gallium nitride as the target 130 and supplying the nitrogen radicals and the hydrogen radicals from the first radical supply source 180.

In step S2030, an aluminum gallium nitride film is formed on the gallium nitride layer 2040 as the first aluminum gallium nitride layer 2050. The aluminum gallium nitride film can be formed by using gallium nitride as the target 130 and supplying aluminum from the dopant supply source 210 in the film formation apparatus 20. That is, the aluminum gallium nitride film can be formed by providing an aluminum target in the dopant supply source 210 of the film formation apparatus 20 described in the Second Embodiment.

In step S2040, an aluminum gallium nitride film doped with silicon is formed on the first aluminum gallium nitride layer 2050 as the second aluminum gallium nitride layer 2060. The aluminum gallium nitride film doped with silicon can be formed using the film formation apparatus 10 described in the First Embodiment. For the aluminum gallium nitride film, aluminum gallium nitride is used as the target 130 of the film formation apparatus 10.

In addition, the aluminum gallium nitride film can also be formed using a film formation apparatus in which the film formation apparatus 10 and the film formation apparatus 20 are integrated (a film formation apparatus in which the vacuum chamber 100 is shared). In this case, gallium nitride is used as the target 130, the $SiH_3$ radicals are supplied from the second radical supply source 190, and aluminum is supplied from the dopant supply source 210.

In step S2050, an aluminum gallium nitride film is formed on the second aluminum gallium nitride layer 2060 as a third aluminum gallium nitride layer 2070. The aluminum gallium nitride film can be formed by using gallium nitride as the target 130 and supplying aluminum from the dopant supply source 210 in the film formation apparatus 20. That is, the aluminum gallium nitride film can be formed by providing an aluminum target in the dopant supply source 210 of the film formation apparatus 20 described in the Second Embodiment.

In step S2060, the third aluminum gallium nitride layer 2070 and the second aluminum gallium nitride layer 2060 are etched into a predetermined pattern using photolithography. The second aluminum gallium nitride layer 2060 is etched so that its surface is exposed (i.e., so that a part of the second aluminum gallium nitride layer 2060 remains). For example, plasma etching can be used as the etching.

In step S2070, a metal film of Ni/Au is formed as the gate electrode 2100.

In step S2080, a metal film of Ti/Al is formed as the source electrode 2080 and the drain electrode 2090.

In step S2090, a silicon nitride film is formed as the first insulating layer 2110 so as to cover the source electrode 2080, the drain electrode 2090, and the gate electrode 2100. The silicon nitride film can be formed using a CVD apparatus.

In step S2100, a silicon oxide film is formed as the second insulating layer 2120 so as to cover the first insulating layer 2110. The silicon oxide film can be formed using a CVD apparatus.

In step S2110, a metal film of Ti/Al is formed on the second insulating layer 2120 as the shield electrode 2130.

As described above, steps S2020 to S2050 can be performed using the film formation apparatus 10 and the film formation apparatus 20 in the manufacture of the semiconductor element 2000 according to the present embodiment. Therefore, the semiconductor element 2000 can be manufactured using a substrate with low heat resistance, for example, a glass substrate. The semiconductor element 2000 in which the dopant of the second aluminum gallium nitride layer 2060 is controlled can be manufactured.

Each of the embodiments described above as the embodiments of the present invention can be appropriately combined and implemented as long as no contradiction is caused. Further, the addition, deletion, or design change of components, or the addition, deletion, or condition change of processes as appropriate by those skilled in the art based on each of the embodiments are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A film formation apparatus, comprising:
   a vacuum chamber capable of evacuating an interior thereof;
   a substrate support portion provided in the vacuum chamber and configured to support a substrate;
   a target support portion provided in the vacuum chamber and configured to support a target containing nitrogen and gallium;
   a sputtering gas supply unit connected to the vacuum chamber and configured to supply a sputtering gas to the vacuum chamber;
   a sputtering power supply configured to apply a voltage to the target;
   a first radical supply source connected to the vacuum chamber and configured to be capable of supplying at least one of nitrogen radicals generated from an $N_2$ gas and hydrogen radicals generated from an $H_2$ gas to the vacuum chamber;
   a second radical supply source connected to the vacuum chamber and configured to be capable of supplying $SiH_3$ radicals to the vacuum chamber; and
   a control unit configured to control the sputtering gas supply unit, the sputtering power supply, the first radical supply source, and the second radical supply source.

2. The film formation apparatus according to claim 1, wherein when both the nitrogen radicals and the hydrogen radicals are supplied to the vacuum chamber, the $N_2$ gas and the $H_2$ gas are supplied to the first radical supply source through separate pipes.

3. The film formation apparatus according to claim 1, wherein the control unit controls the sputtering gas supply unit, the sputtering power supply, the first radical supply source, and the second radical supply source so that a first period in which the sputtering gas, and at least one of the nitrogen radicals and the hydrogen radicals are supplied to the vacuum chamber, and a second period in which the $SiH_3$ radicals is supplied to the vacuum chamber are repeated.

4. The film formation apparatus according to claim 3, wherein in the first period, the control unit controls the start of supplying the sputtering gas and the turning on of the sputtering power supply after starting the supply of at least one of the nitrogen radicals and the hydrogen radicals.

5. The film formation apparatus according to claim 4, wherein in the first period, the control unit controls the stop of supplying at least one of the nitrogen radicals and the hydrogen radicals after stopping the supply of the sputtering gas and turning off the sputtering power supply.

6. The film formation apparatus according to claim 3, wherein in the second period, the control unit controls the sputtering power supply in an on-state.

7. The film formation apparatus according to claim 6, wherein a first power of the sputtering power supply in the first period is greater than a second power of the sputtering power supply in the second period.

8. The film formation apparatus according to claim 1, wherein the second radical supply source is supplied with a $SiH_4$ gas.

9. The film formation apparatus according to claim 8, wherein the second radical supply source is further supplied with a $XeF_2$ gas or a $SiH_2Cl_2$ gas.

10. The film formation apparatus according to claim 3, wherein the second period is shorter than the first period.

11. A film formation apparatus, comprising:

a vacuum chamber capable of evacuating an interior thereof;

a substrate support portion provided in the vacuum chamber and configured to support a substrate;

a target support portion provided in the vacuum chamber and configured to support a target containing nitrogen and gallium;

a sputtering gas supply unit connected to the vacuum chamber and configured to supply a sputtering gas to the vacuum chamber;

a sputtering power supply configured to apply a voltage to the target;

a radical supply source connected to the vacuum chamber and configured to be capable of supplying at least one of nitrogen radicals generated from an $N_2$ gas and hydrogen radicals generated from an $H_2$ gas to the vacuum chamber;

a dopant supply source connected to the vacuum chamber and configured to be capable of supplying a dopant to the vacuum chamber; and a control unit configured to control the sputtering gas supply unit, the sputtering power supply, the radical supply source, and the dopant supply source, wherein the control unit controls the sputtering gas supply unit, the sputtering power supply, the radical supply source, and the dopant supply source so that a first period in which the sputtering gas, and at least one of the nitrogen radicals and the hydrogen radicals are supplied to the vacuum chamber and the sputtering power supply is in an on-state, and a second period in which the dopant is supplied to the vacuum chamber are repeated, and wherein in the first period, the control unit controls the start of supplying the sputtering gas and turning on of the sputtering power supply after starting the supply of at least one of the nitrogen radicals and the hydrogen radicals.

12. The film formation apparatus according to claim 11, wherein when both the nitrogen radicals and the hydrogen radicals are supplied to the vacuum chamber, the $N_2$ gas and the $H_2$ gas are supplied to the radical supply source through separate pipes.

13. The film formation apparatus according to claim 11, wherein in the first period, the control unit controls the stop of supplying at least one of the nitrogen radicals and the hydrogen radicals after stopping the supply of the sputtering gas and turning off of the sputtering power supply.

14. The film formation apparatus according to claim 11, wherein the dopant comprises one of magnesium, indium, and aluminum.

* * * * *